(12) United States Patent
Francis et al.

(10) Patent No.: US 11,510,294 B2
(45) Date of Patent: Nov. 22, 2022

(54) LUMIPHORIC ARRANGEMENTS FOR LIGHT EMITTING DIODE PACKAGES

(71) Applicant: CreeLED, Inc., Durham, NC (US)

(72) Inventors: Aaron Francis, Apex, NC (US); Kyle Damborsky, Apex, NC (US); Robert Wilcox, Rolesville, NC (US); Jasper Cabalu, Apex, NC (US); Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 17/364,987

(22) Filed: Jul. 1, 2021

(65) Prior Publication Data

US 2021/0329758 A1 Oct. 21, 2021

Related U.S. Application Data

(63) Continuation of application No. 16/592,364, filed on Oct. 3, 2019, now Pat. No. 11,083,059.

(51) Int. Cl.
*H05B 45/20* (2020.01)
*H01L 27/15* (2006.01)
*H01L 33/50* (2010.01)
*H01L 33/62* (2010.01)

(52) U.S. Cl.
CPC .......... *H05B 45/20* (2020.01); *H01L 27/156* (2013.01); *H01L 33/50* (2013.01); *H01L 33/62* (2013.01)

(58) Field of Classification Search
CPC ........ H05B 45/20; H01L 27/156; H01L 33/50
USPC ...................................................... 362/555
See application file for complete search history.

(56) References Cited

U.S. PATENT DOCUMENTS

| | | | |
|---|---|---|---|
| 8,039,859 | B2 | 10/2011 | Leung et al. |
| D650,760 | S | 12/2011 | Hussell et al. |
| D667,803 | S | 9/2012 | Hussell et al. |
| D676,000 | S | 2/2013 | Hussell et al. |
| D676,395 | S | 2/2013 | Hussell et al. |
| 8,455,908 | B2 | 6/2013 | Welch et al. |
| 8,564,000 | B2 | 10/2013 | Hussell et al. |
| 8,575,639 | B2 | 11/2013 | Hussell |

(Continued)

OTHER PUBLICATIONS

Non-Final Office Action for U.S. Appl. No. 16/592,364, dated May 14, 2020, 13 pages.

(Continued)

*Primary Examiner* — Bryon T Gyllstrom
(74) *Attorney, Agent, or Firm* — Withrow & Terranova, P.L.L.C.

(57) ABSTRACT

Solid-state lighting devices including light-emitting diodes (LEDs), and more particularly packaged LED devices are disclosed. LED packages are disclosed herein with arrangements of LED chips and corresponding lumiphoric regions that are configured to provide overall light emissions having improved color mixing and emission uniformity. LED packages are further disclosed herein that are configured to be tunable between different colors or correlated color temperatures (CCTs) while providing improved color mixing and emission uniformity. Arrangements may include differing lumiphoric regions that are arranged with various alternating patterns including one or more intersecting lines, rows of alternating lumiphoric regions, patterns that alternate in at least two directions, and checkerboard patterns.

18 Claims, 15 Drawing Sheets

(56) References Cited

U.S. PATENT DOCUMENTS

| | | | |
|---|---|---|---|
| 8,624,271 | B2 | 1/2014 | Reiherzer et al. |
| D702,653 | S | 4/2014 | Wilcox et al. |
| D705,181 | S | 5/2014 | Hussell et al. |
| D706,231 | S | 6/2014 | HUssell et al. |
| D707,192 | S | 6/2014 | Hussell et al. |
| 8,759,847 | B2 | 6/2014 | Xu et al. |
| 8,866,169 | B2 | 10/2014 | Emerson et al. |
| 8,895,998 | B2 | 11/2014 | Hussell et al. |
| 8,921,869 | B2 | 12/2014 | Welch et al. |
| D721,339 | S | 1/2015 | Hussell et al. |
| 8,994,057 | B2 | 3/2015 | Hussell |
| 9,000,470 | B2 | 4/2015 | Tudorica et al. |
| 9,070,850 | B2 | 6/2015 | Keller et al. |
| D736,725 | S | 8/2015 | Wilcox et al. |
| D739,565 | S | 9/2015 | Welch et al. |
| D740,453 | S | 10/2015 | Welch et al. |
| 9,203,004 | B2 | 12/2015 | Hussell et al. |
| 9,209,354 | B2 | 12/2015 | Hussell et al. |
| D750,317 | S | 2/2016 | Lui et al. |
| 9,300,062 | B2 | 3/2016 | Hussell et al. |
| 9,590,155 | B2 | 3/2017 | Hussell et al. |
| 9,698,322 | B2 | 7/2017 | Pickard |
| 9,786,825 | B2 | 10/2017 | Hussell |
| 9,887,327 | B2 | 2/2018 | Reiherzer et al. |
| 10,074,635 | B2 | 9/2018 | Tiwari et al. |
| 10,192,854 | B2 | 1/2019 | Welch et al. |
| 2004/0264193 | A1 | 12/2004 | Dkumura |
| 2005/0063194 | A1* | 3/2005 | Lys .................. B60Q 3/80 362/489 |
| 2009/0096386 | A1 | 4/2009 | Yeh et al. |
| 2010/0103660 | A1 | 4/2010 | van de Ven et al. |
| 2010/0165001 | A1 | 7/2010 | Savvateev et al. |
| 2010/0315320 | A1* | 12/2010 | Yoshida ............ G02F 1/133617 345/83 |
| 2011/0254022 | A1 | 10/2011 | Sasano |
| 2011/0273079 | A1* | 11/2011 | Pickard ................. H01L 33/504 313/483 |
| 2012/0236553 | A1 | 9/2012 | Cash |
| 2013/0003375 | A1 | 1/2013 | Hussell |
| 2013/0141013 | A1 | 6/2013 | Kodama et al. |
| 2014/0268730 | A1 | 9/2014 | Lui et al. |
| 2014/0268750 | A1 | 9/2014 | Lui et al. |
| 2015/0008462 | A1 | 1/2015 | Weng et al. |
| 2015/0069432 | A1 | 3/2015 | Chiu |
| 2015/0076534 | A1 | 3/2015 | Terakami et al. |
| 2015/0179903 | A1 | 6/2015 | Pun et al. |
| 2017/0069606 | A1 | 3/2017 | Gould et al. |
| 2017/0256689 | A1 | 9/2017 | Pickard |
| 2017/0261164 | A1 | 9/2017 | Ogata et al. |
| 2018/0033924 | A1 | 2/2018 | Andrews et al. |
| 2018/0286841 | A1* | 10/2018 | Makanoeich .......... H05B 45/46 |
| 2019/0013447 | A1 | 1/2019 | Kawano et al. |
| 2019/0044040 | A1 | 2/2019 | Andrews |
| 2019/0057954 | A1 | 2/2019 | Blakely et al. |
| 2019/0058003 | A1 | 2/2019 | Blakely et al. |
| 2020/0111766 | A1 | 4/2020 | Kawano |

OTHER PUBLICATIONS

Final Office Action for U.S. Appl. No. 16/592,364, dated Nov. 27, 2020, 14 pages.

Advisory Action for U.S. Appl. No. 16/592,364, dated Feb. 5, 2021, 3 pages.

Notice of Allowance for U.S. Appl. No. 16/592,364, dated Apr. 2, 2021, 11 pages.

International Search Report and Written Opinion for International Patent Application No. PCT/US2020/054088, dated Dec. 21, 2020, 17 pages.

* cited by examiner

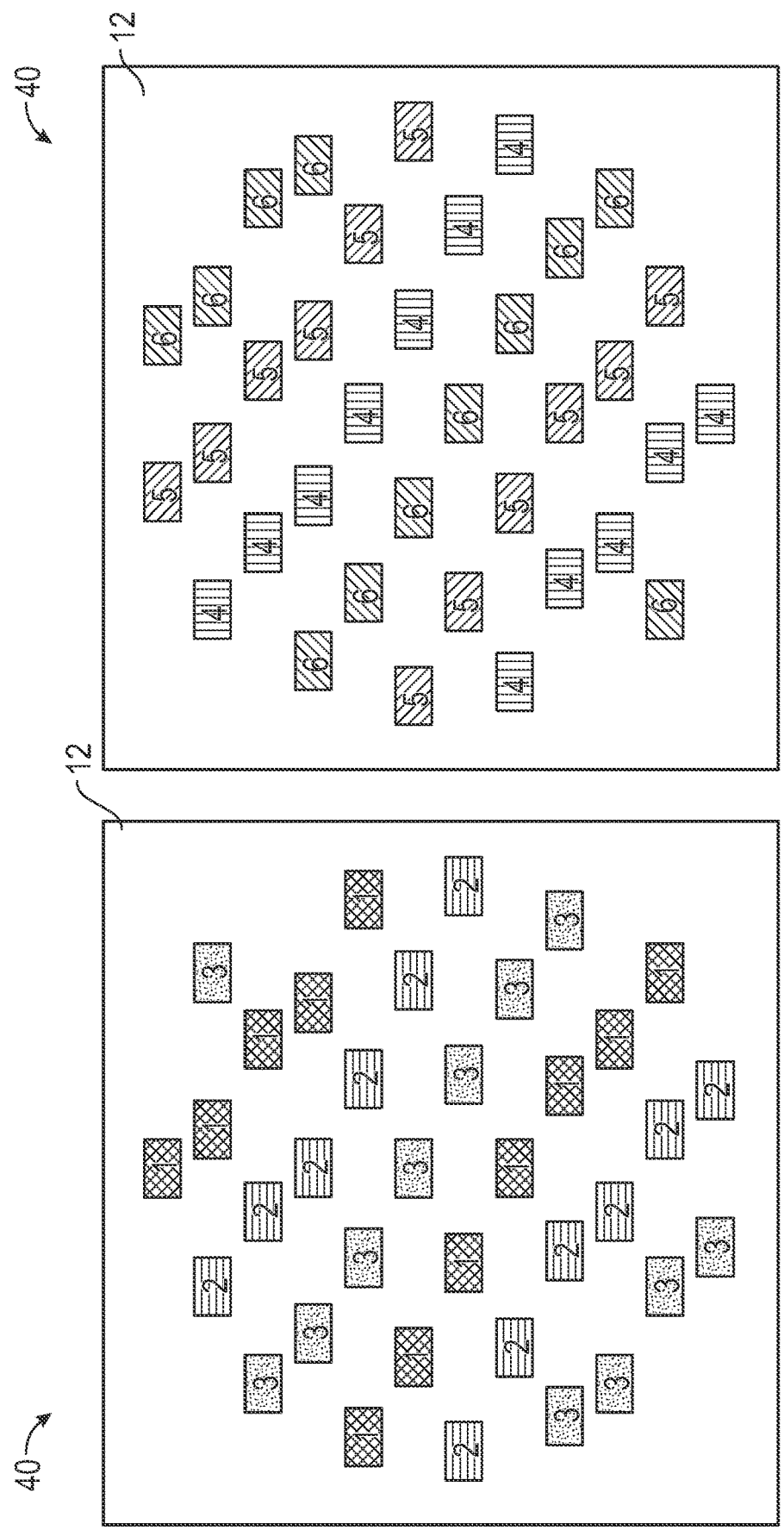

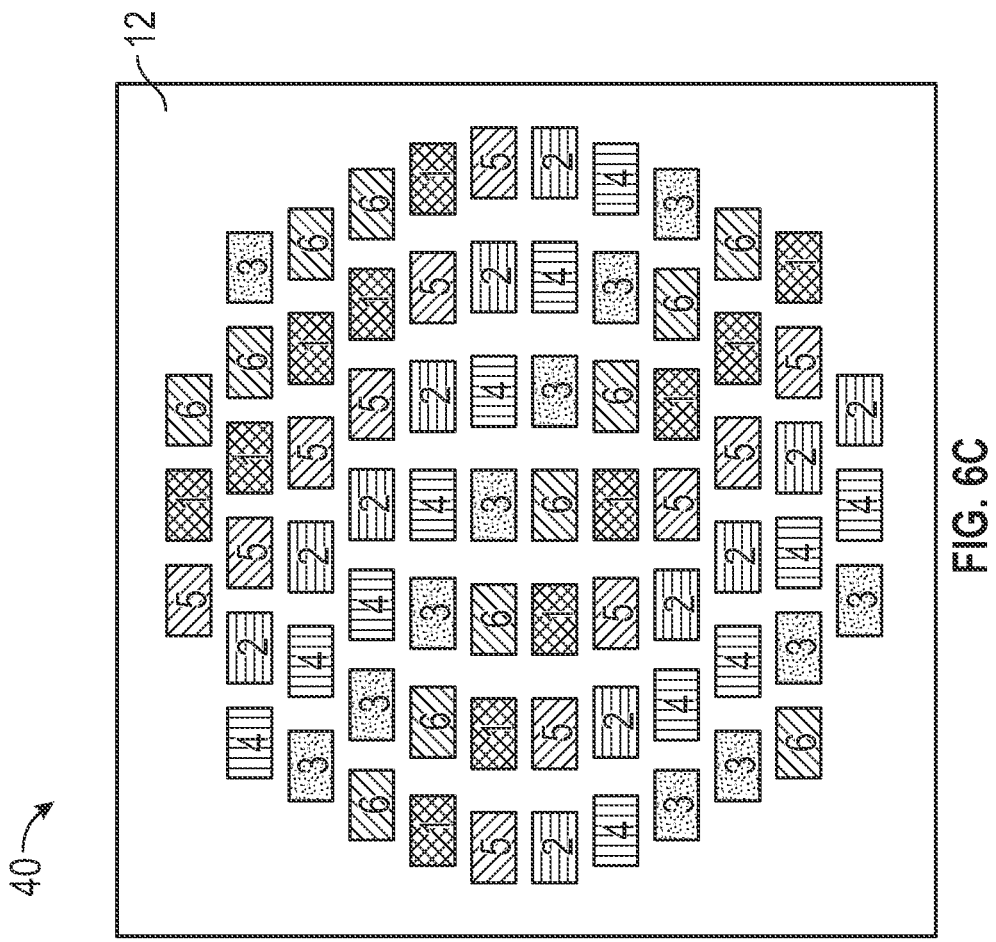

LUMIPHORIC ARRANGEMENTS FOR LIGHT EMITTING DIODE PACKAGES

RELATED APPLICATIONS

This application is a continuation of U.S. patent application Ser. No. 16/592,364, filed Oct. 3, 2019, now U.S. Pat. No. 11,083,059, the disclosure of which is hereby incorporated herein by reference in its entirety.

FIELD OF THE DISCLOSURE

The present disclosure relates to solid-state lighting devices including light-emitting diodes (LEDs), and more particularly to packaged LED devices.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

LED packages have been developed that include a single LED chip or multiple LED chips arranged within the same package. In some multiple LED chip packages, the LED chips can be provided in arrays where emissions corresponding to individual LED chips are combined to produce a desired light emission for the LED package. The emissions corresponding to each individual LED chip in an array can be configured to provide similar colors that are combined to provide an overall light output for the LED package. In other applications, emissions corresponding to different LED chips of the array can be configured to provide different emission colors that are combined and mixed to provide the overall light output. There can be challenges in producing high quality light with uniform emission characteristics when different emission colors are mixed within a common LED package. If the different emission colors are not properly mixed, perceivable color differences may appear in the near field and the far field for the overall light output of the LED package.

The art continues to seek improved light-emitting diodes and solid-state lighting devices having desirable illumination characteristics capable of overcoming challenges associated with conventional lighting devices.

SUMMARY

The present disclosure relates to solid-state lighting devices including light-emitting diodes (LEDs), and more particularly to packaged LED devices. LED packages are disclosed herein with arrangements of LED chips and corresponding lumiphoric regions that are configured to provide overall light emissions having improved color mixing and emission uniformity. LED packages are further disclosed herein that are configured to be tunable between different colors or correlated color temperatures (CCTs) while providing improved color mixing and emission uniformity. Arrangements may include differing lumiphoric regions that are arranged with various alternating patterns including one or more intersecting lines, rows of alternating lumiphoric regions, patterns that alternate in at least two directions, and checkerboard patterns.

In one aspect, an LED package comprises: a submount; a plurality of LED chips on the submount; and an emission area that is registered with the plurality of LED chips, the emission area comprising: a plurality of first lumiphoric regions arranged to form a plurality of first lines; and a plurality of second lumiphoric regions arranged to form a plurality of second lines that intersect with the plurality of first lines. In certain embodiments, the plurality of first lines and the plurality of second lines form intersecting diagonal lines that are configured with ascending or descending stepwise arrangements in the emission area.

In certain embodiments, the plurality of first lines are formed by connecting corners of different first lumiphoric regions of the plurality of first lumiphoric regions, and the plurality of second lines are formed by connecting corners of different second lumiphoric regions of the plurality of second lumiphoric regions. In certain embodiments, a majority of each major edge of each first lumiphoric region of the plurality of first lumiphoric regions is arranged closest to a different second lumiphoric region of the plurality of second lumiphoric regions for at least twenty-five percent of an area of the emission area. In certain embodiments, a majority of each major edge of each second lumiphoric region of the plurality of second lumiphoric regions is arranged closest to a different first lumiphoric region of the plurality of first lumiphoric regions for at least the same twenty-five percent of the area of the emission area.

In certain embodiments, the plurality of first lumiphoric regions and the plurality of second lumiphoric regions form a checkerboard pattern in at least twenty-five percent of an area of the emission area. In certain embodiments, the plurality of first lumiphoric regions and the plurality of second lumiphoric regions form a checkerboard pattern in at least fifty percent of an area of the emission area.

In certain embodiments, the plurality of LED chips comprises a first group of LED chips that are registered with the plurality of first lumiphoric regions and a second group of LED chips that are registered with the plurality of second lumiphoric materials. In certain embodiments, the first group of LED chips is configured to provide emissions of a first peak wavelength and the second group of LED chips is configured to provide emissions of a second peak wavelength that differs from the first peak wavelength by at least 20 nanometers (nm). In certain embodiments, the first group of LED chips comprises one or more serially connected strings of the first group of LED chips and the second group of LED chips comprises one or more serially connected strings of the second group of LED chips.

In certain embodiments, the first group of LED chips and the plurality of first lumiphoric regions are configured to provide emissions of a first CCT value, and the second group of LED chips and the plurality of second lumiphoric regions are configured to provide emissions of a second CCT value that differs from the first CCT value, and each of the first group of LED chips and the second group of LED chips is individually controllable. In certain embodiments, the first CCT value differs from the second CCT value by at least 500 Kelvin (K). In certain embodiments, the LED package is tunable between the first CCT value and the second CCT value. In certain embodiments, the first CCT value is configured above a blackbody locus (BBL) and the second CCT value is configured below the BBL. In certain embodiments, the first CCT value and the second CCT value are provided within the same American National Standards Institute (ANSI) defined color space. In certain embodiments, the plurality of LED chips comprises a third group of LED chips and each of the first group of LED chips, the second group of LED chips, and the third group of LED chips is individually controllable such that overall emissions of the LED package are tunable along a blackbody locus. In certain embodiments, the third group of LED chips is configured to provide monochromatic emissions In certain embodiments, the LED package further comprises: a retention material that at least partially bounds the emission area, the retention material comprising a light-altering material; and a plurality of electrical traces that are arranged between the retention material and the submount, wherein the plurality of LED chips form a plurality of serially connected strings that are electrically connected to the plurality of electrical traces. In certain embodiments, at least one serially connected string of the plurality of serially connected strings is arranged to transverse the emission area a plurality of times. In certain embodiments, the plurality of first lumiphoric regions and the plurality of second lumiphoric regions comprise spray-coated lumiphoric materials. In certain embodiments, the plurality of first lumiphoric regions and the plurality of second lumiphoric regions comprise preformed structures.

In another aspect, an LED package comprises: a submount; a plurality of LED chips on the submount; and an emission area that is registered with the plurality of LED chips, the emission area comprising a plurality of first lumiphoric regions and a plurality of second lumiphoric regions that are arranged along a plurality of rows, wherein each row of the plurality of rows comprises an alternating arrangement of the plurality of first lumiphoric regions and the plurality of second lumiphoric regions, and positions of the plurality of first lumiphoric regions within each row are offset between nearest adjacent rows of the plurality of rows.

In certain embodiments, a majority of each major edge of each first lumiphoric region of the plurality of first lumiphoric regions is arranged closest to a different second lumiphoric region of the plurality of second lumiphoric regions for at least twenty-five percent of an area of the emission area. In certain embodiments, a majority of each major edge of each second lumiphoric region of the plurality of second lumiphoric regions is arranged closest to a different first lumiphoric region of the plurality of first lumiphoric regions for at least the same twenty-five percent of the area of the emission area. In certain embodiments, the plurality of first lumiphoric regions and the plurality of second lumiphoric regions form a checkerboard pattern in at least twenty-five percent of an area of the emission area.

In certain embodiments, the plurality of LED chips comprises: a first group of LED chips that are registered with the plurality of first lumiphoric regions to provide emissions of a first CCT value; and a second group of LED chips that are registered with the plurality of second lumiphoric regions to provide emissions of a second CCT value that differs from the first CCT value, wherein each of the first group of LED chips and the second group of LED chips is individually controllable. In certain embodiments, the first CCT value differs from the second CCT value by at least 500 K. In certain embodiments, the LED package is tunable between the first CCT value and the second CCT value. In certain embodiments, the first CCT value is configured above a BBL and the second CCT value is configured below the BBL. In certain embodiments, the first group of LED chips is configured to provide emissions of a first peak wavelength and the second group of LED chips is configured to provide emissions of a second peak wavelength that differs from the first peak wavelength by at least 20 nm.

In another aspect, an LED package comprises: a submount; a plurality of LED chips arranged on the submount to form an emission area, the plurality of LED chips comprising a plurality of first LED chips that are arranged in a pattern that alternates in at least two directions with a plurality of second LED chips within the emission area; a plurality of first lumiphoric regions that are registered with the plurality of first LED chips and a plurality of second lumiphoric regions that are registered with the plurality of second LED chips; a light-altering material that at least partially bounds the emission area; and a plurality of electrical traces arranged between the light-altering material and the submount and electrically connected to the plurality of LED chips. In certain embodiments, the LED package is tunable between the first CCT value and the second CCT value. In certain embodiments, the first CCT value is configured above a BBL and the second CCT value is configured below the BBL. In certain embodiments, the first group of LED chips is configured to provide emissions of a first peak wavelength and the second group of LED chips is configured to provide emissions of a second peak wavelength that differs from the first peak wavelength by at least 20 nm.

In certain embodiments, the plurality of electrical traces are arranged concentrically about the emission area. In certain embodiments, the plurality of first LED chips are electrically connected to different electrical traces of the plurality of electrical traces than the plurality of second LED chips. In certain embodiments, the plurality of first LED chips are arranged in a plurality of serially connected strings and at least one serially connected string of the plurality of serially connected strings is arranged to transverse the emission area a plurality of times. In certain embodiments, the plurality of first lumiphoric regions and the plurality of second lumiphoric regions comprise spray-coated lumiphoric materials. In certain embodiments, the plurality of first lumiphoric regions and the plurality of second lumiphoric regions comprise preformed structures.

In certain embodiments, the plurality of first LED chips and the plurality of first lumiphoric regions are configured to provide emissions of a first CCT value, the plurality of second LED chips and the plurality of second lumiphoric regions are configured to provide emissions of a second CCT value that differs from the first CCT value, and each of the plurality of first LED chips and the plurality of second LED chips is individually controllable. In certain embodiments, the first CCT value differs from the second CCT value by at least 500 K.

In another aspect, an LED package comprises: a submount; a plurality of first LED chips and a plurality of first lumiphoric regions that are configured to provide emissions of a first CCT value that are configured above a BBL; a plurality of second LED chips and a plurality of second lumiphoric regions that are configured to provide emissions of a second CCT value that are configured below the BBL, wherein the plurality of first LED chips and the plurality of second LED chips are individually controllable. In certain embodiments, the first CCT value comprises a delta u', v' value that is 0.004 above the BBL and the second CCT value comprises a delta u', v' value that is 0.004 below the BBL. In certain embodiments, the first CCT value comprises a delta u', v' value above the BBL that is different from a delta u', v' value of the second CCT value that is below the BBL. In certain embodiments, the plurality of first lumiphoric regions are arranged to form a plurality of first lines and the plurality of second lumiphoric regions are arranged to form plurality of second lines that intersect with the plurality of first lines.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 6A-6C are top views illustrating generalized layout patterns for various strings of LED chips of FIG. 5 according to embodiments disclosed herein.

DETAILED DESCRIPTION

Figure 1A:
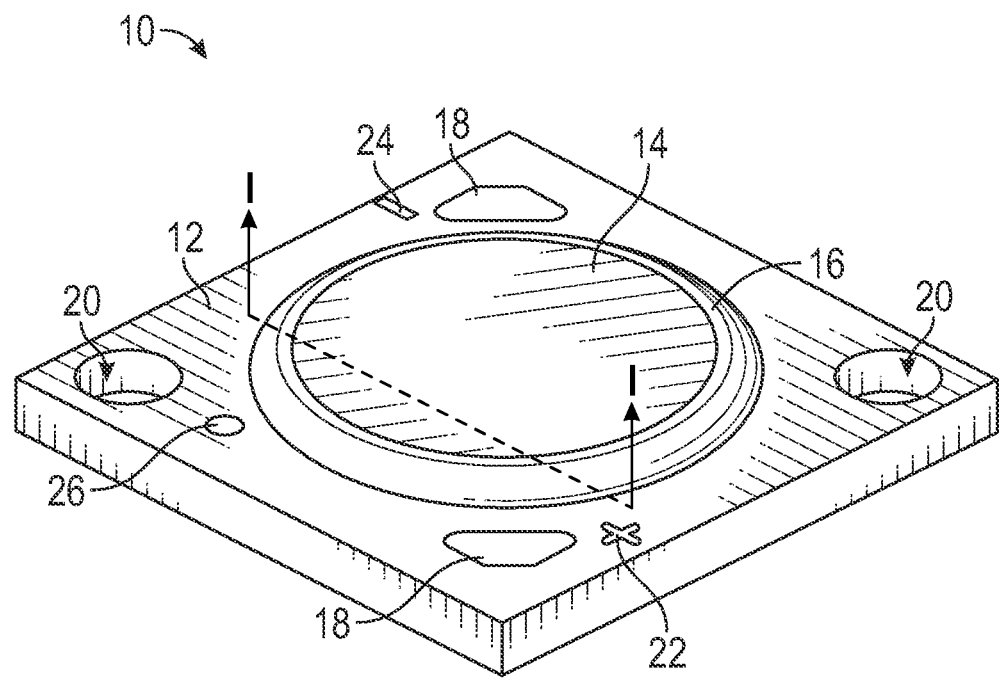
FIG. 1A illustrates a top perspective view of a representative light-emitting diode (LED) package according to embodiments disclosed herein.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The present disclosure relates to solid-state lighting devices including light-emitting diodes (LEDs), and more particularly to packaged LED devices. LED packages are disclosed herein with arrangements of LED chips and corresponding lumiphoric regions that are configured to provide overall light emissions having improved color mixing and emission uniformity. LED packages are further disclosed herein that are configured to be tunable between different colors or correlated color temperatures (CCTs) while providing improved color mixing and emission uniformity. Arrangements may include differing lumiphoric regions that are arranged with various alternating patterns including one or more intersecting lines, rows of alternating lumiphoric regions, patterns that alternate in at least two directions, and checkerboard patterns.

An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition (MOCVD). The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including but not limited to, buffer layers, nucleation layers, super lattice structures, undoped layers, cladding layers, contact layers, current-spreading layers, and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of the active LED structure can emit different wavelengths of light depending on the composition of the active layer and n-type and p-type layers. For example, the active LED structure for various LEDs may emit blue light with a peak wavelength range of approximately 430 nanometers (nm) to 480 nm, green light with a peak wavelength range of 500 nm to 570 nm, or red or red-orange light with a peak wavelength range of 600 nm to 650 nm. In certain embodiments, red light may include a peak wavelength range of 600 nm to 700 nm, or 650 nm to 700 nm depending on the application. The LED chip can also be covered with one or more lumiphoric materials or other conversion materials, such as phosphors, such that at least some of the light from the LED chip is absorbed by the one or more phosphors and is converted to one or more different wavelength spectra according to the characteristic emission from the one or more phosphors. In certain embodiments, the combination of the LED chip and the one or more phosphors emits a generally white combination of light. The one or more phosphors may include yellow (e.g., YAG:Ce), green (e.g., LuAg:Ce), and red (e.g., $Ca_{1-x-y}Sr_x Eu_y AlSiN_3$) emitting phosphors, and combinations thereof.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips.

Light emitted by the active layer or region of the LED chip typically has a lambertian emission pattern. For directional applications, internal mirrors or external reflective surfaces may be employed to redirect as much light as possible toward a desired emission direction. Internal mirrors may include single or multiple layers. Some multi-layer mirrors include a metal reflector layer and a dielectric reflector layer, wherein the dielectric reflector layer is arranged between the metal reflector layer and a plurality of semiconductor layers. A passivation layer may be arranged between the metal reflector layer and first and second electrical contacts, wherein the first electrical contact is arranged in conductive electrical communication with a first semiconductor layer, and the second electrical contact is arranged in conductive electrical communication with a second semiconductor layer. In certain embodiments, the first and second electrical contacts themselves may be configured as mirror layers. For single or multi-layer mirrors including surfaces exhibiting less than 100% reflectivity, some light may be absorbed by the mirror. Additionally, light that is redirected through the active LED structure may be absorbed by other layers or elements within the LED chip.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In certain embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (for example, at least 80% reflective) may be considered a reflective material. In the case of ultraviolet (UV) LEDs, appropriate materials may be selected to provide a desired, and in certain embodiments high, reflectivity, and/or a desired, and in certain embodiments low, absorption. In certain embodiments, a "light-transmissive" material may be configured to transmit at least 50% of emitted radiation of a desired wavelength. In certain embodiments, an initially "light-transmissive" material may be altered to be a "light-absorbing material" that transmits less than 50% of emitted radiation of a desired wavelength with the addition of one or more light-absorbing materials, such as opaque or non-reflective materials including grey, dark, or black particles or materials.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side or face of the LED chip that is opposite a substrate, such as a growth substrate. In an LED package, a lateral geometry LED chip may be mounted on a submount of the LED package such that the anode and cathode are on a face of the active LED structure that is opposite the submount. In this arrangement, wirebonds may be used to provide electrical connections with the anode and cathode. Certain embodiments disclosed herein relate to the use of flip chip LED devices in which a light transmissive substrate represents an exposed light-emitting surface. In such arrangements, the anodes and cathodes of LED chips that are flip-chip mounted may be mounted or bonded to electrical traces or patterns on the submount of the corresponding LED package. LED packages as disclosed herein may include arrangements that include one or more of submounts, electrical connections, light-altering materials, reflective materials, encapsulants, lenses, optics, and lumiphoric materials on or supporting one or more LED chips.

Embodiments of the disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Common elements between figures may be shown herein with common element numbers and may not be subsequently re-described.

FIG. 1A illustrates a top perspective view of an LED package 10. The LED package 10 includes a submount 12 for supporting one or more LEDs chips. The submount 12 may also be referred to as a substrate for the LED package 10. An emission area 14 may be disposed over the submount 12 such that the emission area 14 corresponds or is registered with locations of one or more LED chips on the submount 12. In certain embodiments, the emission area 14 may be disposed substantially centrally with respect to the LED package 10. In the alternative, the emission area 14 may be disposed in any location over the LED package 10, for example, in a corner, adjacent an edge, or generally offset from center. In further alternative arrangements, a plurality of separate emission areas 14 may be provided on the submount 12. The emission area 14 may comprise a substantially circular shape. In other embodiments, the emission area 14 may comprise any other suitable shape, for example, a substantially square, oval, or rectangular shape. Notably, the LED package 10 may form or provide a uniform optical source in the form of the emission area 14 which can simplify the manufacturing process for manufacturers of lighting products requiring high light output from a single component. The LED package 10 may further comprise a retention material 16 disposed at least partially about the emission area 14. In certain embodiments, the retention material 16 may be configured to retain one or more encapsulation and/or lumiphoric materials that cover LED chips on the submount 12 and as such, the retention material 16 can sometimes be referred to as a dam. The retention material 16 can also be disposed over other electrical devices that are provided on the submount 12, including one or more electrostatic discharge (ESD) protection devices, such as one or more Zener diodes.

The submount 12 can comprise any suitable mounting submount or substrate, for example, a printed circuit board (PCB), a metal core PCB (MCPCB), an external circuit, or any other suitable submount or substrate over which lighting devices such as LED chips can mount and/or attach. In certain embodiments, suitable materials for the submount 12 may include, but are not limited to ceramic materials such as aluminum oxide ($Al_2O_3$) or alumina, aluminum nitride (AlN), or organic insulators like polyimide (PI) and polyphthalamide (PPA), or various PCB and MCPCB materials. One or more intervening layers may be disposed between the emission area 14 and the submount 12 such that the emission area 14 is indirectly disposed over the submount 12. In certain embodiments, the emission area 14 may be directly disposed over one or more portions of the submount 12. In certain embodiments, the submount 12 may comprise dimensions in a range including a 10 millimeter (mm) by 10 mm square footprint to a 40 mm by 40 mm square footprint, although smaller and larger dimensions are possible without deviating from aspects disclosed herein. For such submount 12 arrangements, corresponding dimensions for the emission area 14 may comprise a length or a diameter for circular configurations in a range including 5 mm to 35 mm, although smaller and larger dimensions are possible without deviating from aspects disclosed herein. In other embodiments, the submount 12 and the corresponding emission area 14 may comprise any suitable dimension and/or shape, such as one or more combinations of circular, oval, triangular, and rectangular shapes.

In certain embodiments, the retention material 16 may comprise a light-altering material that is adapted for dispensing, or placing, and may include many different materials including light-reflective materials that reflect or redirect light, light-absorbing materials that absorb light, and materials that act as a thixotropic agent. In certain embodiments, light-altering materials may include at least one of fused silica, fumed silica, and titanium dioxide ($TiO_2$) particles suspended in a binder, such as silicone or epoxy. In certain embodiments, the retention material 16 with light-altering materials may form a white color to reflect and/or redirect light. In other embodiments, light-altering materials may comprise an opaque or black color for absorbing light and providing increased contrast with the emission area 14 of the LED package 10. In certain embodiments, the retention material 16 can be dispensed or deposited in place using an automated dispensing machine where any suitable size and/or shape can be formed. The retention material 16 may form a cross-sectional profile having a planar top surface with vertical side surfaces or a curved top surface with vertical side surfaces. In other embodiments, the retention material 16 may form other shapes, including a planar or curved top surface with non-planar or non-vertical side surfaces. In certain embodiments, at least a portion of the retention material 16 may extend to one or more edges of the submount 12. In certain embodiments, the retention material 16 may be adapted to reflect light by way of a coating of reflective material that is provided on one or more surfaces of the retention material 16.

The LED package 10 may comprise one or more electrical attachment surfaces 18. The electrical attachment surfaces 18 may comprise electrical contacts or electrical pads such as solder contacts for the LED package 10. As such, the electrical attachment surfaces 18 may be referred to as package bond pads. The electrical attachment surfaces 18 can be any suitable configuration, size, shape and/or location and can comprise positive and negative electrode terminals through which an electrical current or signal can pass when connected to an external power source. One or more electrically conductive wires (not shown) can be attached and electrically connected to the electrical attachment surfaces 18 when welded, soldered, or by any other suitable known attachment method. As such, an electrical current or signal can pass into the LED package 10 by way of the electrical attachment surfaces 18 to facilitate light output from the emission area 14. In certain embodiments, the LED package 10 may comprise at least one opening or hole 20 that can be disposed through an entire thickness of the submount 12 or at least partially through a thickness of the submount 12 for facilitating attachment of the LED package 10 to an external surface. For example, one or more screws can be inserted through the at least one hole 20 for securing the LED package 10 to another member, structure, substrate, or housing of a lighting fixture. The LED package 10 may comprise one or more indicator signs or symbols for denoting the electrical polarity for a given side of the LED package 10. For example, a first symbol 22 can comprise a plus ("+") sign denoting a side of the LED package 10 where one of the electrical attachment surfaces 18 forms a positive electrode terminal. A second symbol 24 can comprise a minus ("−") sign denoting a side of the LED package 10 where one of the electrical attachment surfaces 18 forms a negative electrode terminal. In certain embodiments, one or more test points 26 may be located on the submount 12 for testing one or more electrical and/or thermal properties of the LED package 10.

Figure 1B:
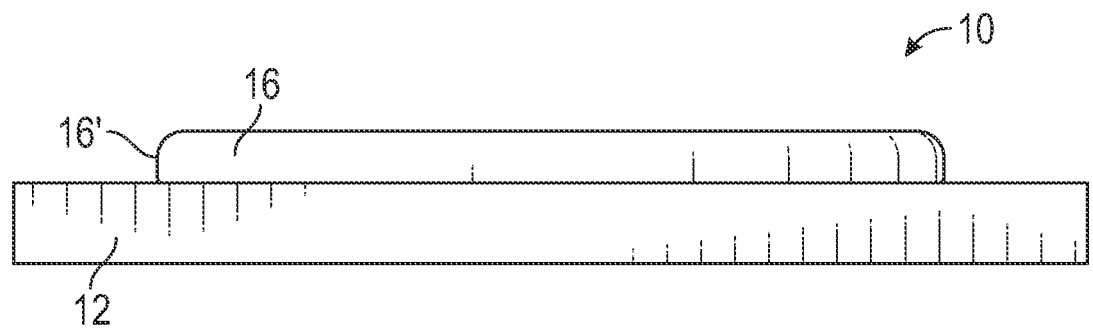
FIG. 1B illustrates a side view of the LED package of FIG. 1A.

FIG. 1B illustrates a side view of the LED package 10 of FIG. 1A. As illustrated in FIG. 1A and FIG. 1B, the retention material 16 may form a substantially circular dam disposed about at least a portion of the emission area 14 and disposed over the submount 12. The retention material 16 may be dispensed, positioned, or otherwise placed over the submount 12 and may comprise any suitable size and/or shape. In certain embodiments, an outer wall 16' of the retention material 16 may be arranged inset from lateral boundaries of the submount 12. In other embodiments, the outer wall 16' may be aligned or registered with one or more lateral edges of the submount 12.

Figure 1C:
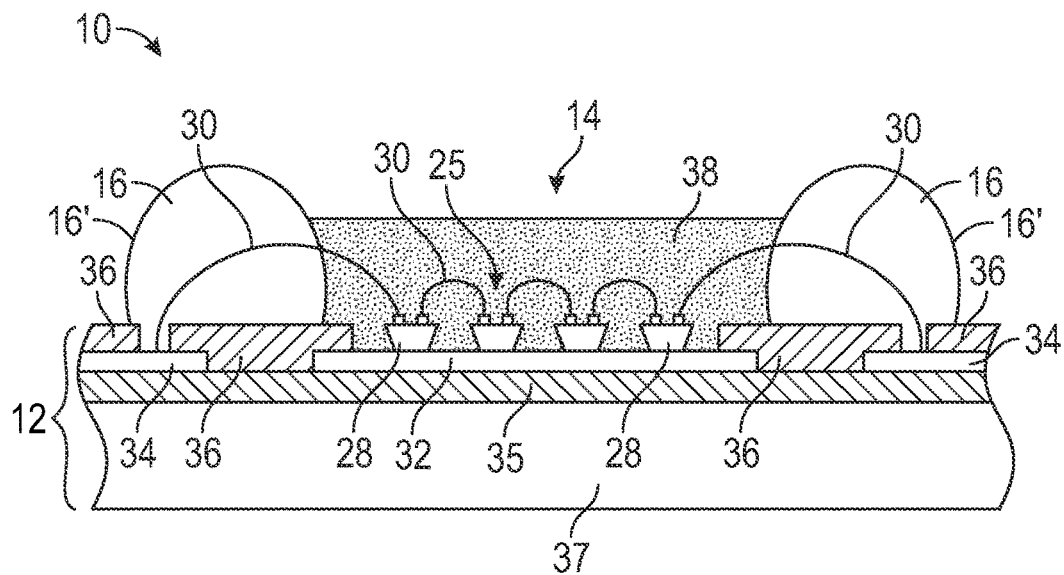
FIG. 1C is a partial cross-sectional view of the LED package of FIG. 1A taken along the sectional line I-I of FIG. 1A.

FIG. 1C is a partial cross-sectional view of the LED package 10 of FIG. 1A taken along the sectional line I-I of FIG. 1A. As illustrated, a plurality of LED chips 28 are registered with the emission area 14. The plurality of LED chips 28 may comprise any suitable size and/or shape, including rectangular and square, with squared or beveled edges, or any other suitable shape. For illustrative purposes, four LED chips 28 are illustrated that are electrically connected in series by way of wire bonds 30. In various embodiments, any number of LED chips 28 may be connected in series, parallel, and combinations of series and parallel arrangements on the submount 12. While wire bonds 30 are illustrated in FIG. 1C, the LED chips 28 may alternatively be configured for flip-chip mounting to the submount 12. In certain embodiments, the LED chips 28 may be arranged over a mounting pad 32 such that the LED chips 28 are thermally coupled to the mounting pad 32 either directly or indirectly by way of one or more intervening layers. In this manner, the mounting pad 32 may be configured to dissipate heat generated by the LED chips 28. The LED chips 28 may be attached to the mounting pad 32 or intervening layers using any attachment means known in art. For example, the LED chips 28 may be attached using solder pastes, epoxies, or flux. The mounting pad 32 can be formed integral as one piece of the submount 12, or the mounting pad 32 can comprise a separate layer or piece that is disposed over the submount 12. In certain embodiments, the mounting pad 32 may be omitted.

Electrically conductive traces 34 may be arranged on or integral with the submount 12 to provide electrical connections to the LED chips 28. In certain embodiments, pairs of electrically conductive traces 34 respectively form anode and cathode connections for one or more of the LED chips 28. The mounting pad 32 and the electrically conductive traces 34 may comprise any suitable electrical and thermally conductive materials and can comprise either the same or different materials. In certain embodiments, the mounting pad 32 and the electrically conductive traces 34 comprise a layer of copper (Cu) or alloys thereof deposited over a portion of the submount 12. In certain arrangements, an optional dielectric layer 35 may be provided between portions of the submount 12 and one or more of the mounting pad 32 and the electrically conductive traces 34. An electrically insulating solder mask 36 may be disposed at least partially between the mounting pad 32 and the electrically conductive traces 34 to prevent electrical shorting between solder material used to attach the LED chips 28 and the electrically conductive traces 34. Notably, portions of the solder mask 36 that extend over the electrically conductive traces 34 may form one or more openings such that one or more of the wire bonds 30 may be electrically connected to one or more of the electrically conductive traces 34. In this regard, the submount 12 may comprise one or more of the electrically conductive traces 34, the mounting pad 32, the dielectric layer 35, and the solder mask 36 on a core layer 37 or structure. The core layer 37 may comprise any of the submount 12 materials as described above, such as one or more of ceramic materials and PCB materials. In certain embodiments, the retention material 16 may be dispensed after certain ones of the wire bonds 30 are electrically connected between one or more of the LED chips 28 and the electrically conductive traces 34. In this manner, the retention material 16 may be disposed over and at least partially covering portions of one or more of the wirebonds 30 to provide encapsulation thereof.

As illustrated in FIG. 1C, a filling material 38 is disposed within the retention material 16 to cover the LED chips 28 within the emission area 14. In certain embodiments, the filling material 38 may comprise an encapsulant having a predetermined, or selective, amount of lumiphoric material in an amount suitable for any desired light emission, for example, suitable to provide white light emission from the LED package 10. The filling material 38 may interact with light emitted from the LED chips 28 such that a perceived white light, or any suitable and/or desirable wavelength of light, can be observed. Any suitable combination of encapsulant and/or lumiphoric materials including phosphors can provided within the filling material 38, and combinations of different phosphors may be used. In other embodiments, the filling material 38 can form a molded lens. The filling material 38 can be substantially opaque such that the emission area 14 can be substantially opaque (as illustrated in FIG. 1), transparent, or semi-transparent depending upon, for example, the amount and type of lumiphoric materials used. As previously described, the retention material 16 can be adapted for dispensing, or placing, about at least a portion of the emission area 14. After placement of the retention material 16, the filling material 38 may be selectively filled to any suitable level within a space defined between one or more inner walls of the retention material 16. In certain embodiments, the filling material 38 can be filled to a level equal to the height of retention material 16 or to any level above or below the retention material 16. An upper surface of the filling material 38 may form a planar or curved shape in any suitable manner, such as concave or convex.

Figure 1D:
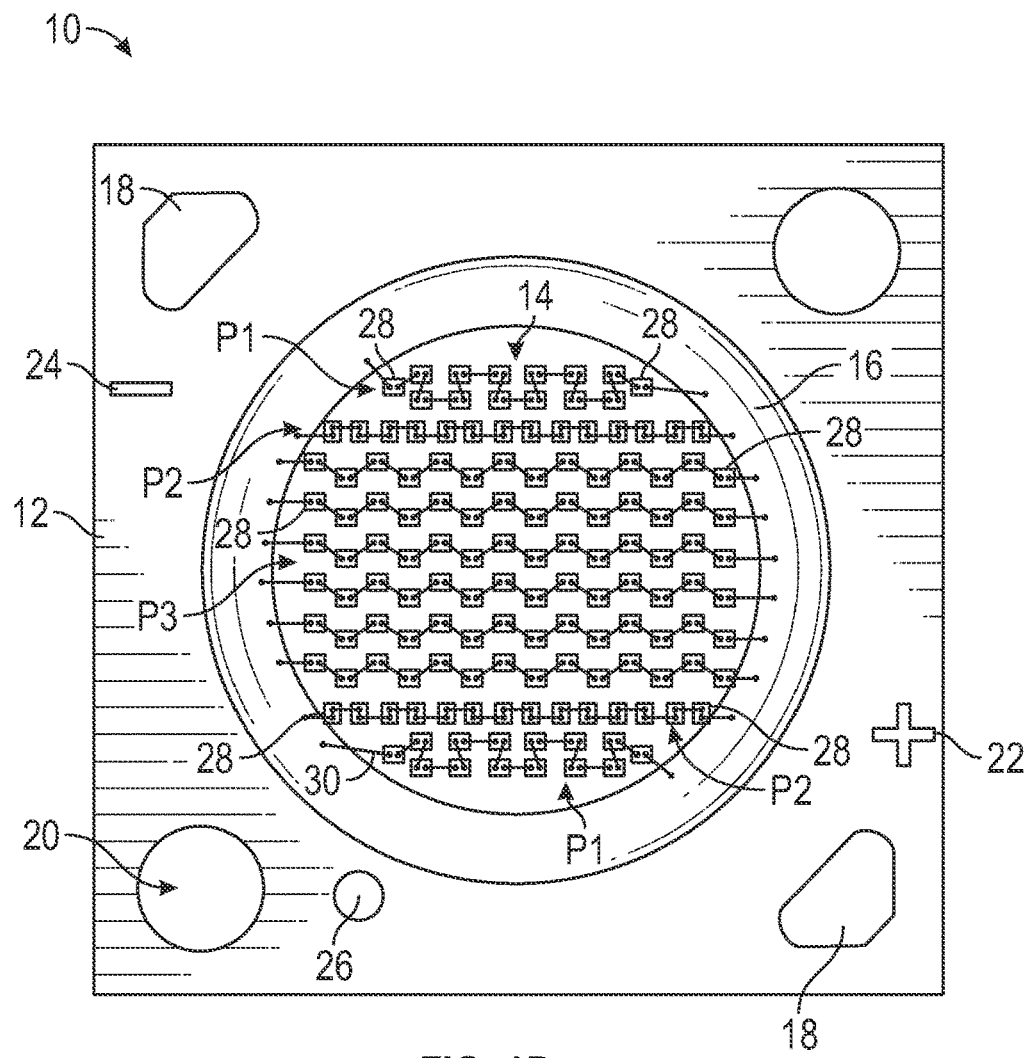
FIG. 1D is a top view illustration of the LED package of FIG. 1A showing a plurality of LED chips that are visible within an emission area.

FIG. 1D is a top view illustration of the LED package 10 of FIG. 1A without the filling material 38 as described in FIG. 1C. In this manner, the LED chips 28 are arranged to form an array that is integrated within the emission area 14. In certain embodiments, the LED chips 28 may be arranged or disposed in sets that may comprise one or more strings of the LED chips 28. A given set of LED chips 28 may for example comprise one or more strings of LED chips 28 that are electrically connected in series, parallel, combinations thereof, or any other suitable configuration. More than one set of LED chips 28 may be provided, and each set of LED chips 28 may be arranged in parallel to one or more other sets of LED chips 28. As described further herein, the LED chips 28 in any given set or string may be arranged in any suitable pattern or configuration, and even LED chips 28 within a given set or string may be arranged or disposed in one or more different patterns or configurations. For example, FIG. 1D illustrates at least three sets of LED chips 28 arranged in three patterns, for example, a first pattern P1, a second pattern P2, and a third pattern P3. Each of the patterns P1, P2, and P3 may form a consistent or variable pattern design across the emission area 14. More than one of the patterns P1, P2, and/or P3 can be used. Each of the patterns P1, P2, and/or P3 may alternate or be arranged in any suitable configuration. For illustration purposes, only three patterns P1, P2, P3 are illustrated, although any number of patterns or arrangements is contemplated, and patterns may comprise any suitable design. In certain embodiments, one or more patterns or arrangements may include one or more of a checkerboard design, a grid design, and any arrangement wherein certain ones of the LED chips 28 are at least substantially aligned in at least two directions. By way of example, in FIG. 1D, the pattern P1 comprise LED chips 28 provided in a grid arrangement, the pattern P2 comprises LED chips 28 provided in a line arrangement, and the pattern P3 comprises LED chips 28 provided in a checkerboard arrangement. Notably the pattern P3 may form the checkerboard pattern with one or more groups or sets of LED chips 28 alternating both above and below horizontal lines. In certain embodiments, the pattern P3 may form the checkerboard pattern with multiple strings of LED chips 28. In this manner, the various patterns P1, P2, and P3 may be provided to form an array of the LED chips 28 within the emission area 14.

As illustrated in FIGS. 1A-1D, the LED chips 28 and lumiphoric materials may be configured to provide the LED package 10 with a desired light output. For example, the LED package 10 may be provided with a CCT in a range including 1800 Kelvin (K) to 10,000 K. In certain applications, the emission area 14 of the LED package 10 may be configured with localized sub-regions that are configured to provide colors with different CCTs. In conventional applications, localized sub-regions may typically divide the emission area 14 to form several discrete regions that are sized large enough to accommodate electrical connections of multiple LEDs configured to provide common-colored emissions. For example, the large discrete regions may form large stripes where each stripe corresponds to one or more serially connected strings of LEDs with lumiphoric materials. The presence of such large discrete regions providing differing light colors can create challenges in providing uniform emission characteristics for the LED package 10. For example, the discrete regions can be perceived as visible color differences in the overall light output for the LED package 10 in one or more of the near field and the far field.

Figure 2:
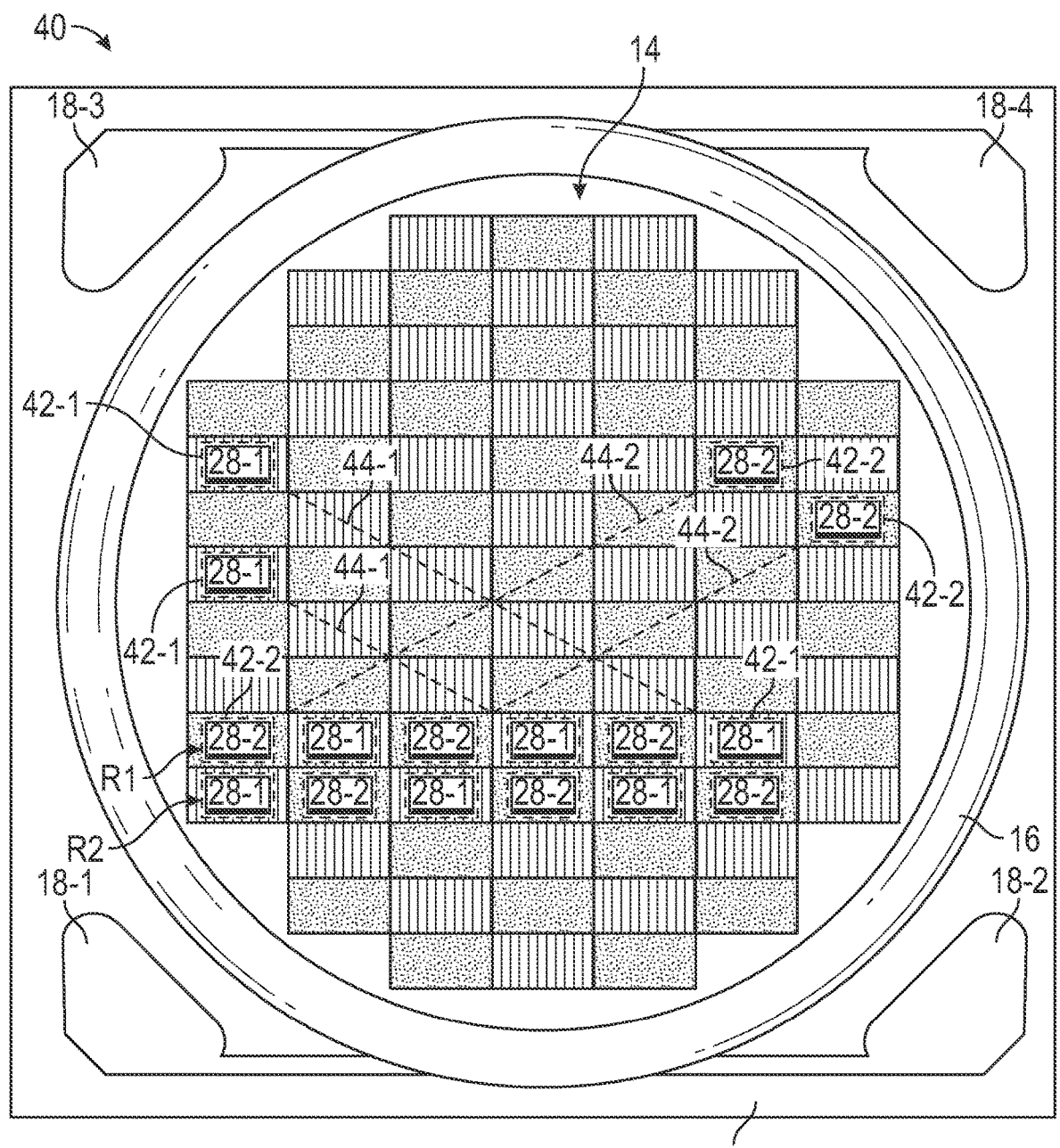
FIG. 2 is a top view illustration of an LED package that is configured to provide different colors or correlated color temperatures (CCTs) with improved uniformity of overall light emissions according to embodiments disclosed herein.

FIG. 2 is a top view illustration of an LED package 40 that is configured to provide different colors or CCTs with improved uniformity of overall light emissions from the LED package 40. As illustrated, the LED package 40 includes the emission area 14 that is at least partially surrounded by the retention material 16. As previously described, the retention material 16 may comprise a light-altering material configured to reflect, redirect, absorb, or otherwise alter light emissions from the emission area 14. A plurality of LED chips including a first group of LED chips 28-1 (or first LED chips 28-1) and a second group of LED chips 28-2 (or second LED chips 28-2) are arranged on the submount 12 and registered with the emission area 14. A number of small dashed boxes labeled with either 28-1 or 28-2 are superimposed in FIG. 2 to illustrate locations of corresponding ones of the LED chips 28-1, 28-2. In certain embodiments, the first group of LED chips 28-1 may be binned according to a same or similar dominant or peak wavelength bin as the second group of LED chips 28-2. In other embodiments, the first group of LED chips 28-1 and the second group of LED chips 28-2 may be binned according to different dominant or peak wavelength bins. For example, the first group of LED chips 28-1 may be configured to provide emissions of a first peak wavelength and the second group of LED chips 28-2 may be configured to provide emissions of a second peak wavelength, and the first peak wavelength differs from the second peak wavelength by at least 20 nm, or at least 50 nm, or at least 100 nm. A plurality of first lumiphoric regions 42-1 are registered with the first group of LED chips 28-1 and a plurality of second lumiphoric regions 42-2 are registered with the second group of LED chips 28-2. A number of slightly larger dashed boxes are superimposed around the dashed boxes of the LED chips 28-1, 28-2 to illustrate locations of corresponding ones of the first and second lumiphoric regions 42-1, 42-2. In certain embodiments, the plurality of first lumiphoric regions 42-1 are configured to convert emissions from the first group of LED chips 28-1 to a different wavelength spectra than conversions of emissions from the second group of LED chips 28-2 that are provided by the plurality of second lumiphoric regions 42-2. In this manner, a combined light output corresponding to the first group of LED chips 28-1 and the plurality of first lumiphoric regions 42-1 comprises a first CCT, and a combined light output corresponding to the second group of LED chips 28-2 and the plurality of second lumiphoric regions 42-2 comprises a second CCT that differs from the first CCT. In certain embodiments, the first and second CCTs may each be configured within a range including 1800 K to 10,000 K, and the first and second CCTs may differ by at least 500 K. The lumiphoric regions 42-1, 42-2 may be formed after the LED chips 28-1, 28-2 and the retention material 16 are formed on the submount 12. In certain embodiments, an encapsulant material, such as silicone or the like, may be provided over the lumiphoric regions 42-1, 42-2 and laterally bounded by the retention material 16. In other embodiments, such encapsulant material may be omitted.

The LED package 40 may comprise a plurality of electrical attachment surfaces 18-1 to 18-4, pairs of which may form anode-cathode pairs for each of the first and second groups of LED chips 28-1, 28-2. For example, the electrical attachment surfaces 18-1, 18-2 may form a respective anode and cathode pair for one or more strings of the first group of LED chips 28-1, and the electrical attachment surfaces 18-3, 18-4 may form a respective anode and cathode pair for one or more strings of the second group of LED chips 28-1. By providing different anode and cathode connections, each of the first and second groups of LED chips 28-1, 28-2 may be individually controllable, thereby providing the LED package 40 with tunable brightness and/or CCT emissions. While FIG. 2 illustrates the first and second groups of LED chips 28-1, 28-2, LED packages described herein may be provided with any number of LED chip groups, such as three or more, or four or more, and so on depending on the application. For each additional group of LED chips, additional electrical attachment surfaces may be provided that form separate anode-cathode pairs that correspond to each additional group of LED chips.

As illustrated in FIG. 2, arrangements of the first and second groups of LED chips 28-1, 28-2 and the first and second lumiphoric regions 42-1, 42-2 are provided to promote improve color mixing for an overall light output of the LED package 40. In certain embodiments, the plurality of first lumiphoric regions 42-1 and corresponding first LED chips 28-1 are arranged to form a plurality of first lines 44-1 of the first lumiphoric regions 42-1 within the emission area 14. In a similar manner, the plurality of second lumiphoric regions 42-2 and corresponding second LED chips 28-2 are arranged to form a plurality of second lines 44-2 of the second lumiphoric regions 42-2 within the emission area 14. In FIG. 2, the first lines 44-1 and the second lines 44-2 are formed diagonally with corresponding ascending or descending stepwise arrangements of the first and second LED chips 28-1, 28-2 and the first and second lumiphoric regions 42-1, 42-2. Notably, one or more of the first lines 44-1 and one or more the second lines 44-2 are arranged to intersect with another within the emission area 14. As oriented in FIG. 2, the plurality of first lines 44-1 and the plurality of second lines 44-2 form intersecting diagonal lines across or within the emission area 14. For illustrative purposes, only two of the first lines 44-1 and two of the second lines 44-2 are shown with superimposed dashed lines; however, the emission area 14 may include any number of first and second lines 44-1, 44-2. In certain embodiments, the stepwise arrangement provides physical connections between corners of different ones of the first lumiphoric regions 42-1 along the first lines 44-1 and between corners of different ones of the second lumiphoric regions 42-2 along the second lines 44-2. In this manner, the plurality of first lines 44-1 may be formed by connecting corners of different first lumiphoric regions 42-1, and the plurality of second lines 44-2 may be formed by connecting corners of different second lumiphoric regions 42-2. As such, individual first lumiphoric regions 42-1 may be laterally surrounded along all major edges or borders thereof by a number of the second lumiphoric regions 42-2 with other first lumiphoric regions 42-1 only provided at corners thereof. Individual second lumiphoric regions 42-2 may be laterally surrounded in a similar manner. Stated differently, for an individual first lumiphoric region 42-1, a majority of each major edge or border of the individual first lumiphoric region 42-1 may be arranged closest to different second lumiphoric regions 42-2. In certain embodiments, such arrangements of first and second lumiphoric regions 42-1, 42-2 may occupy at least 25%, or at least 50%, or at least 75% or more of the emission area 14 for improved color mixing. As illustrated, the arrangements of the first and second lumiphoric regions 42-1, 42-2 and corresponding LED chips 28-1, 28-2 may form a checkerboard pattern within the emission area 14 for improved color mixing of the overall light output from the LED package 40. As described herein, a checkerboard pattern of first and second lumiphoric regions generally refers to an alternating pattern of first and second lumiphoric regions wherein neighboring lumiphoric regions of the same type (e.g., first or second) are arranged at or close to corners thereof. Additionally, the first and second lumiphoric regions 42-1, 42-2 and corresponding first and second LED chips 28-1, 28-2 may be arranged along a plurality of rows, designated as R1, R2 in FIG. 2. In certain embodiments, each of the rows R1, R2 may comprise an alternating arrangement of the first and second lumiphoric regions 42-1, 42-2 and corresponding first and second LED chips 28-1, 28-2. In certain embodiments, the positions within each row R1, R2 of the first and second lumiphoric regions 42-1, 42-2 and corresponding first and second LED chips 28-1, 28-2 may be offset between nearest adjacent rows R1, R2, to provide one or more of offset tile and checkerboard patterns. Again, such patterns or arrangements may occupy at least 25%, or at least 50%, or at least 75% or more of the emission area 14 for improved color mixing.

Figure 3:
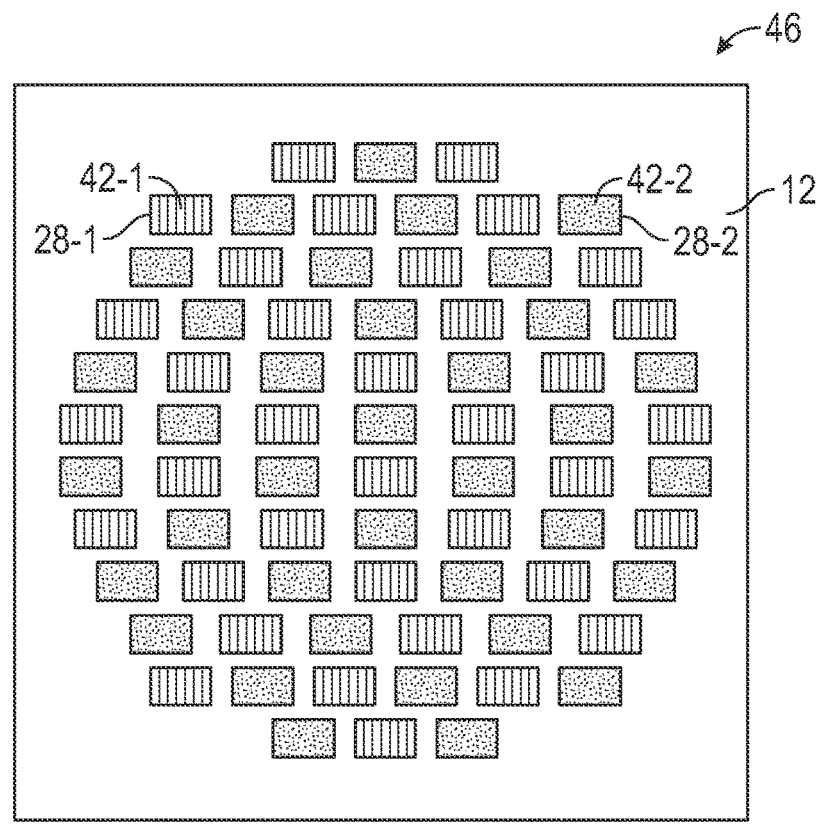
FIG. 3 is a top view illustration of an LED chip layout for an LED package that is configured to provide two different colors or CCTs with improved uniformity of overall light emissions according to embodiments disclosed herein.

FIG. 3 is a top view illustration of an LED chip layout for an LED package 46 that is configured to provide two different colors or CCTs with improved uniformity of overall light emissions. In this regard, FIG. 3 may provide a generalized layout for an embodiment of the LED package 40 of FIG. 2. As illustrated, the first and second lumiphoric regions 42-1, 42-2 and corresponding first and second LED chips 28-1, 28-2 may be arranged along a plurality of rows. The positions within each row of the first and second lumiphoric regions 42-1, 42-2 and corresponding first and second LED chips 28-1, 28-2 may be offset between nearest adjacent rows, to provide one or more of offset tile and checkerboard patterns. In order to provide two different colors or CCTs within the LED package 46, each of the first LED chips 28-1 and corresponding first lumiphoric regions 42-1 may collectively provide the first CCT value and each of the second LED chips 28-2 and corresponding second lumiphoric regions 42-2 may collectively provide the second CCT value. To provide differing first and second CCT values, such as differing by at least 500 K, any combination of first and second LED chips 28-1, 28-2 and corresponding first and second lumiphoric regions 42-1, 42-2 may be provided. For example, the first and second LED chips 28-1, 28-2 may be binned according to a same or similar dominant or peak wavelength bin while the first and second lumiphoric regions 42-1, 42-2 may comprise at least one different lumiphoric material. By way of example, the first and second LED chips 28-1, 28-2 may be binned to the same or similar blue wavelength bin, such as between 445 nm and 455 nm, while the first lumiphoric regions 42-1 comprise yellow and/or green lumiphoric materials and the second lumiphoric regions 42-2 comprise yellow and/or green lumiphoric materials with the addition of red lumiphoric materials. Accordingly, the first LED chips 28-1 and corresponding first lumiphoric regions 42-1 may collectively provide first CCT values within cool white (e.g., 3500 K-4500 K) color space, and the second LED chips 28-2 and corresponding second lumiphoric regions 42-2 may collectively provide second CCT values within warm white (e.g., 2700 K-3000 K) color spaces. In certain embodiments, the first and second CCT values may be provided within different American National Standards Institute (ANSI) defined color spaces. In further embodiments, differing first and second CCT values may be provided with first and second LED chips 28-1, 28-2 of different colors (e.g., differing by at least 10 nm, or at least 20 nm, or more), and the first and second lumiphoric regions 42-1, 42-1 may comprise different lumiphoric materials as described above. In still further embodiments, differing first and second CCT values may be provided with first and second LED chips 28-1, 28-2 of differing colors (e.g., differing by at least 10 nm, or at least 20 nm, or more), and the first and second lumiphoric regions 42-1, 42-2 may comprise the same lumiphoric materials or mixtures thereof. In certain embodiments, each group of first and second LED chips 28-1, 28-2 may be individually controllable, thereby providing the LED package 46 with emission characteristics that are tunable between two differing CCT values.

Figure 4:
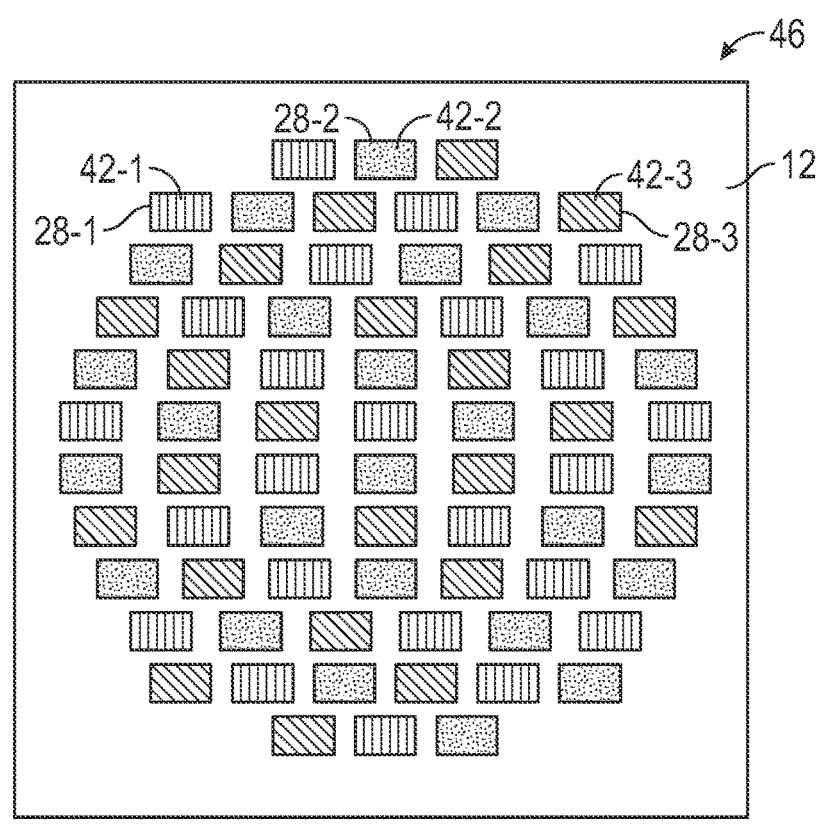
FIG. 4 is a top view illustration of an LED chip layout for an LED package that is configured to provide three different colors or CCTs with improved uniformity of overall light emissions according to embodiments disclosed herein.

While the above-described embodiments are illustrated to provide two differing CCT values, LED packages described herein may be provided with any number of differing CCT values, such as three or more, or four or more, and so on depending on the application. By way of example, FIG. 4 is a top view illustration of an LED chip layout for an LED package 48 that is configured to provide three different colors or CCTs with improved uniformity of overall light emissions. In this manner, the first LED chips 28-1 and corresponding first lumiphoric regions 42-1, the second LED chips 28-2 and corresponding second lumiphoric regions 42-2, and third LED chips 28-3 and corresponding third lumiphoric regions 42-3 may be configured to provide three differing CCT values. In other embodiments, one or more of the first, second, and third LED chips 28-1 to 28-3 may be configured without corresponding lumiphoric regions to provide LED chips with single color or monochromatic emissions, such as LED chips configured to provide one of red, blue, or green emissions. In certain embodiments, each group of first, second, and third LED chips 28-1 to 28-3 may be individually controllable, thereby providing the LED package 48 with emission characteristics that are tunable between three differing CCT values.

In order to provide tunable LED packages with individually controllable groups of LED chips, separate electrical connection lines are typically needed for differing groups of LED chips. Conventional LED packages may typically position groups of LED chips and corresponding lumiphoric regions together in larger common areas, at least in part to allow adequate pathways for separate electrical connection lines. As previously described, such arrangements can lead to perceivable color differences in the near and/or far fields of such LED packages. According to embodiments disclosed herein, electrical connection layouts are disclosed that provide individually controllable connections to differing groups of LED chips and corresponding lumiphoric regions that comprise improved color mixing arrangements.

Figure 5:
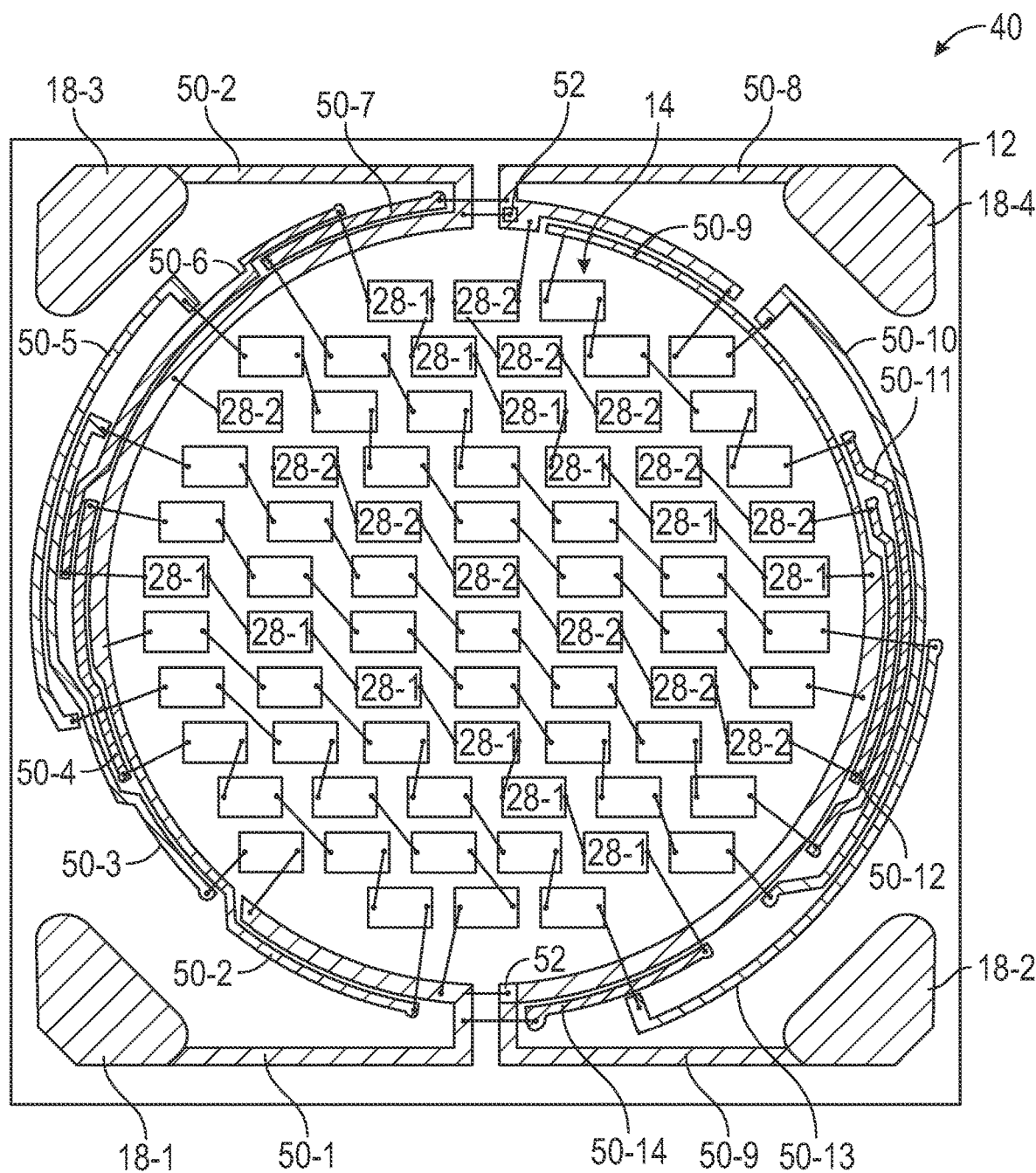
FIG. 5 is a top view illustration of an electrical connection layout for the LED package of FIG. 2 that provides individually controllable connections for groups of LED chips.

FIG. 5 is a top view illustration of an electrical connection layout for the LED package 40 of FIG. 2 that provides individually controllable connections for the first and second groups of LED chips 28-1, 28-2. For illustrative purposes, the top view of the LED package 40 of FIG. 5 is provided before application of the retention material 16 and the first and second lumiphoric regions 42-1, 42-2 of FIG. 2. For the first and second groups of LED chips 28-1, 28-2, four electrical attachment surfaces 18-1 to 18-4 are provided. In this manner, the electrical attachment surfaces 18-1, 18-2 form a first anode-cathode pair for the first group of LED chips 28-1, and the electrical attachment surfaces 18-3, 18-4 form a second anode-cathode pair for the second group of LED chips 28-2. In certain embodiments, the first and second groups of LED chips 28-1, 28-2 may respectively form one or more strings of serially connected LED chips 28-1, 28-2. As illustrated in FIG. 5 and further described in FIGS. 6A and 6B, the first group of LED chips 28-1 forms three strings of serially connected LED chips 28-1 that are connected in parallel with one another between the electrical attachment surfaces 18-1, 18-2, and the second group of LED chips 28-2 forms three strings of serially connected LED chips 28-2 that are connected in parallel with one another between the electrical attachment surfaces 18-3, 18-4. In other embodiments, any number of serially connected strings may be provided.

In order to facilitate various electrical connections, a plurality of electrical traces 50-1 to 50-14 are arranged on the submount 12 around a perimeter of the first and second groups of LED chips 28-1, 28-2. In this manner, the plurality of electrical traces 50-1 to 50-14 may form electrical buses that route electrical connections. For illustrative purposes, a particular string of the first group of LED chips 28-1 and a particular string of the second group of LED chips 28-2 are labeled in FIG. 5. As illustrated, an electrical path is provided from the electrical attachment surface 18-1 that includes the electrical trace 50-1 and the electrical trace 50-14, six serially connected LED chips 28-1 connected between the electrical trace 50-14 and the electrical trace 50-6, six more serially connected LED chips 28-1 connected between the electrical trace 50-6 and the electrical trace 50-9 and the electrical attachment surface 18-2. In this manner, the labeled string of LED chips 28-1 comprises twelve serially connected LED chips 28-1 that are electrically connected between the electrical attachment surfaces 18-1, 18-2 by way of a plurality of the electrical traces (e.g., 50-1, 50-14, 50-6, 50-9 in electrical path order). In a similar manner, the labeled string of LED chips 28-2 comprises twelve serially connected LED chips 28-2 that are electrically connected between the electrical attachment surfaces 18-3, 18-4 by way of a plurality of the electrical traces (e.g., 50-2, 50-12, 50-8 in electrical path order). In certain embodiments, the electrical traces 50-1 to 50-14 allow a same serially connected string of LED chips 28-1, 28-2 to transverse across the emission area 14 a number of times.

For individually controllable embodiments, the first LED chips 28-1 and the second LED chips 28-2 may be electrically connected to different electrical traces of the plurality of electrical traces 50-1 to 50-14. The LED package 40 may also comprise one or more other electrical devices 52, such as ESD devices as previously described that are electrically connected between pairs of the electrical attachment surfaces 18-1 to 18-4. In other embodiments, other electrical devices, such as one or more thermistors, may be provided on the submount 12 and electrically connected to different electrical traces and corresponding attachment surfaces that are electrically isolated from the LED chips 28-1, 28-2. Notably, the electrical traces 50-1 to 50-14 and the other electrical devices 52 may be arranged on the submount 12 along locations where the retention material 16 of FIG. 2 may be formed. As such, different portions of the retention material 16 of FIG. 2 may cover two or more, three or more, four or more, or five or more concentrically arranged electrical traces 50-1 to 50-14. In this manner, the electrical traces 50-1 to 50-14 and the other electrical devices 52 can be arranged between the retention material (16 of FIG. 2) and the submount 12 to be removed or hidden from the emission area 14 for increased light output. While wire bond 30 connections are illustrated in FIG. 5, the embodiments disclosed herein may also be provided with flip-chip mounted LED chips 28-1, 28-2 and corresponding electrical traces on the submount 12 in place of the wire bonds 30. In further embodiments, the LED chips 28-1, 28-2 may comprise chip-scale packages (CSPs) which typically are formed as packaged LED chips that are sized the same or close to the size of unpackaged LED chips. CSP LEDs may include one or more of a submount or PCB on which the bare LED chip is mounted and may also include one or more encapsulant materials or lumiphoric materials. In certain embodiments, CSP LEDs may comprise lumiphoric materials that are formed thereon before the CSP LEDs are mounted on the submount 12. In other embodiments, CSP LEDs may be mounted on the submount 12 and lumiphoric materials may be subsequently formed on the CSP LEDs. While FIG. 5 illustrates the first and second groups of LED chips 28-1, 28-2, LED packages described herein may be provided with any number of LED chip groups, such as three or more, or four or more, and so on depending on the application. For each additional group of LED chips, additional electrical attachment surfaces and corresponding electrical traces may be provided that form separate electrically conductive paths for each group of LED chips.

FIGS. 6A-6C are top views illustrating generalized layout patterns for various strings of the LED chips 28-1, 28-2 of FIG. 5. FIG. 6A illustrates a layout of three separate serially connected strings (designated as strings 1, 2, and 3) that correspond to the second group of LED chips 28-2 for the LED package 40 of FIG. 5. In a similar manner, FIG. 6B illustrates a layout of three separate serially connected strings (designated as strings 4, 5, and 6) that correspond to the first group of LED chips 28-1 for the LED package 40 of FIG. 5. FIG. 6C illustrates a combined layout corresponding to all of the serially connected strings 1-3 of the LED chips 28-2 and the serially connected strings 4-6 of the LED chips 28-1. Notably, each of the serially connected strings 1-6 may be divided into smaller segments of LED chips 28-1, 28-2 that are provided in alternating arrangements with other segments of other serially connected strings 1-6 across the submount 12. For such arrangements, the serially connected strings 4-6 of the LED chips 28-1 can be electrically coupled in parallel with one another between the electrical attachment surfaces 18-1, 18-2 of FIG. 5, and the serially connected strings 1-3 of the LED chips 28-2 can be electrically coupled in parallel with one another between the electrical attachment surfaces 18-3, 18-4 of FIG. 5.

As described herein, certain embodiments provide LED packages with individually controllable LED chips or individually controllable strings of LEDs chips, thereby providing LED packages with tunable light emission colors and intensities therefrom.

Color reproduction can commonly be measured using color rendering index (CRI) or average color rendering index (CRI Ra). To calculate the CRI, the color appearance of 14 reflective samples is simulated when illuminated by a reference radiator (illuminant) and a test source. The CRI Ra is a modified average utilizing the first eight indices, all of which have low to moderate chromatic saturation. (R9 is one of six saturated test colors not used in calculating CRI, with R9 embodying a large red content.) The CRI and CRI Ra are used to determine how closely an artificial light source matches the color rendering of a natural light source at the same CCT. Daylight has a high CRI Ra (approximately 100), with incandescent bulbs also being relatively close (CRI Ra greater than 95), and fluorescent lighting being less accurate (with typical CRI Ra values of approximately 70-80).

The reference spectra used in CRI calculations are chosen as ideal illumination sources defined in terms of their color temperature. As a heated object becomes incandescent, it first glows reddish, then yellowish, then white, and finally bluish. Thus, apparent colors of incandescing materials are directly related to their actual temperature (in K). Practical materials that incandesce are said to have CCT values that are directly related to color temperatures of blackbody sources.

Figure 7A:
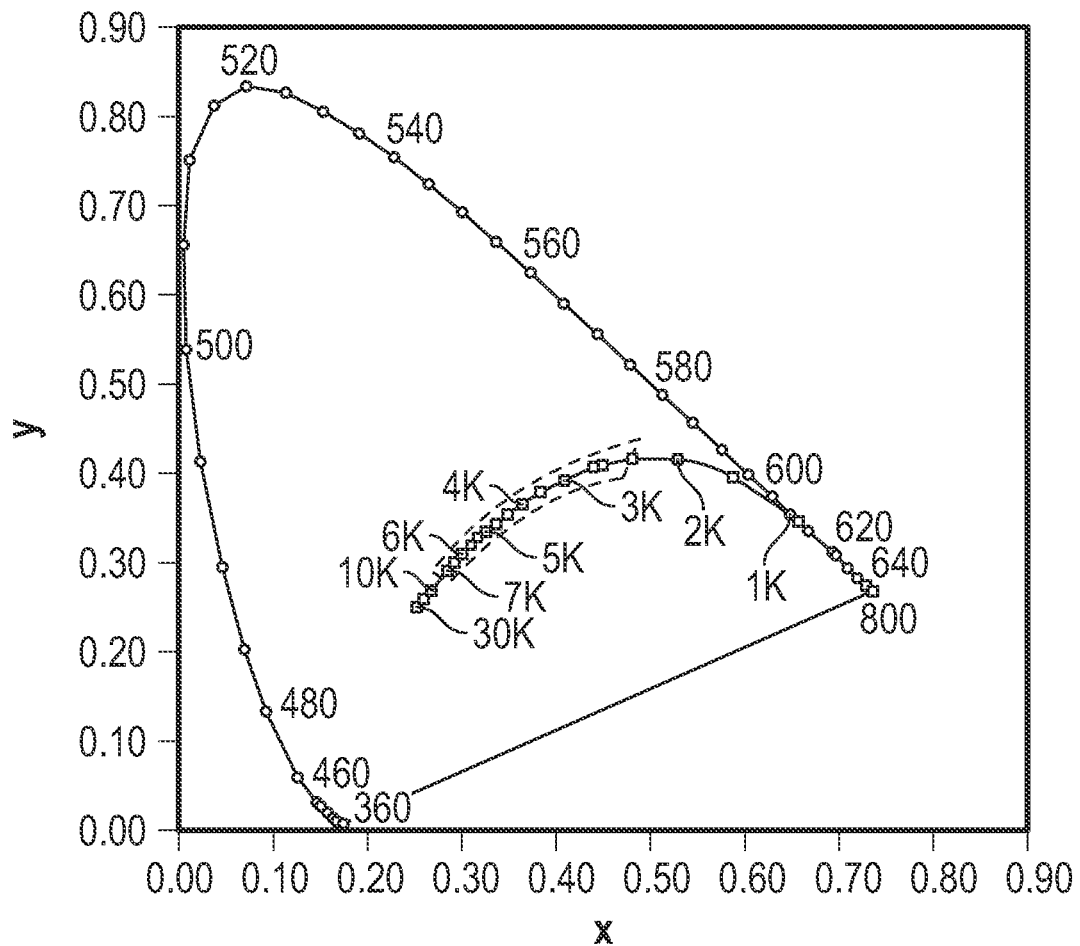
FIG. 7A is a schematic illustration of the 1931 Commission International de l'Eclairage (CIE) Chromaticity Diagram.

Aspects disclosed herein may be better understood with reference to the 1931 Commission International de l'Eclairage (CIE) Chromaticity Diagram, which is well-known and of which a copy is reproduced in FIG. 7A. The 1931 CIE Chromaticity Diagram maps out the human color perception in terms of two CIE color coordinate parameters x and y (sometimes indicated as CCx and CCy). The spectral colors are distributed around the edge of the outlined space, which includes all of the hues perceived by the human eye. The boundary lines represents maximum saturation for the spectral colors. The chromaticity coordinates (i.e., color points) that lie along the blackbody locus (BBL) (also known as the Planckian locus) obey Planck's equation: $E(\lambda)=A\lambda^{-5}/(e^{B/T}-1)$, where E is the emission intensity, A is the emission wavelength, T is the color temperature of the blackbody, and A and B are constants. Color coordinates that lie on or near the BBL (which embodies a curved line emanating from the right lower corner) yield pleasing white light to a human observer. The 1931 CIE Diagram includes temperature listings along the BBL, with these temperature listings showing the color path of a blackbody radiator that is caused to increase to such temperatures. As a heated object becomes incandescent, it first glows reddish, then yellowish, then white, and finally bluish. This occurs because the wavelength associated with the peak radiation of the blackbody radiator becomes progressively shorter with increased temperature, consistent with the Wien Displacement Law. Illuminants which produce light that is on or near the BBL can thus be described in terms of their color temperature. A white light area proximate to (i.e., within approximately a MacAdam eight-step ellipse of) the BBL and between 2,500 K and 10,000 K, is shown in FIG. 7A, although other color temperatures may also be referred to as white light in certain applications.

Figure 7B:
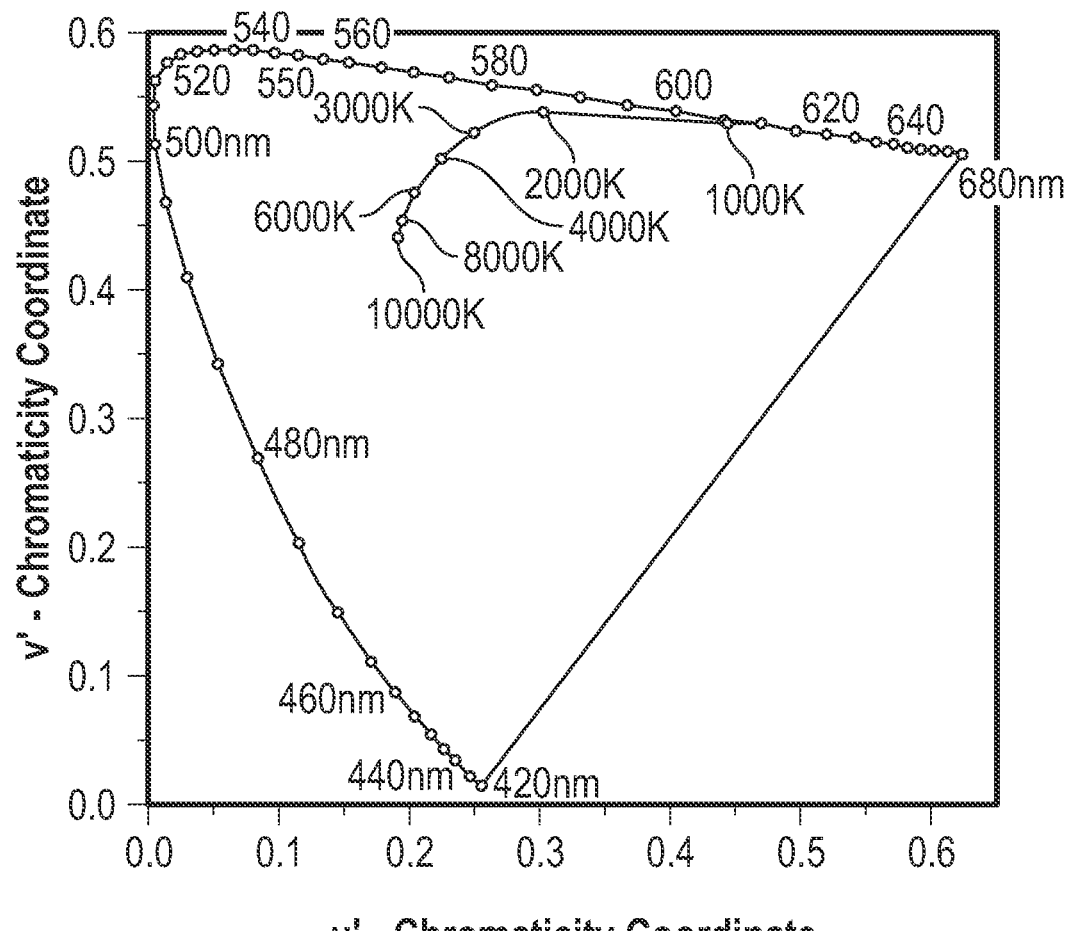
FIG. 7B is a schematic illustration of the 1976 CIE Chromaticity Diagram.

The term "white light" or "whiteness" does not clearly cover the full range of colors along the BBL since it is apparent that a candle flame and other incandescent sources appear yellowish, i.e., not completely white. Accordingly, the color of illumination may be better defined in terms of CCT and in terms of its proximity to the BBL. The pleasantness and quality of white illumination decreases rapidly if the chromaticity point of the illumination source deviates from the BBL by a distance of greater than 0.01 in the x, y chromaticity system. This corresponds to the distance of about a MacAdam four-step ellipse, a standard employed by the lighting industry. For the 1976 CIE Chromaticity Diagram as illustrated in FIG. 7B, a MacAdam four-step ellipse corresponds to or is essentially the same as a delta u', v' (or Du'v') of 0.004 in the u', v' coordinate system. A lighting device emitting light having color coordinates that are within a MacAdam four-step ellipse of the BBL and that has a CRI Ra greater than 80 is generally acceptable as a white light for general illumination purposes. A lighting device emitting light having color coordinates within a MacAdam seven- or eight-step ellipse of the BBL and that has a CRI Ra greater than 70 is used as the minimum standards for many other white lighting devices including compact fluorescent and solid-state lighting devices.

The 1976 CIE Chromaticity Diagram, also well-known and readily available to those of ordinary skill in the art, maps human color perception in terms of CIE parameters u' and v'. The 1976 CIE Chromaticity Diagram (also known as the (u'v') chromaticity diagram) is reproduced at FIG. 7B. The spectral colors are distributed around the edge of the outlined space, which includes all of the hues perceived by the human eye. The boundary line represents maximum saturation for the spectral colors. The 1976 CIE Chromaticity Diagram is similar to the 1931 Diagram, except that the 1976 Diagram has been modified such that similar distances on the Diagram represent similar perceived differences in color. Since similar distances on the 1976 Diagram represent similar perceived differences in color, deviation from a point on the 1976 Diagram can be expressed in terms of the coordinates u' and v', e.g., distance from the point=$(\Delta u'2+\Delta v'2)^{1/2}$, and the hues defined by a locus of points that are each a common distance from a specified hue consist of hues that would each be perceived as differing from the specified hue to a common extent. Delta u', v' (Du'v') is a metric that quantifies the distance between a color point and a point on the BBL having the same CCT in the u', v' coordinate system. A negative Du'v' value indicates a color point below the BBL and a positive Du'v' value indicates a point above the BBL. Du'v' may also be used to quantify the absolute distance between two separate color points. In the u', v' coordinate system, a MacAdam four-step ellipse may be essentially the same as a Du'v' of 0.004. In certain applications, Du'v' can be a preferred way to represent absolute color differences between two color points or between a color point and a point on the BBL having the same CCT.

FIGS. 8A-11B illustrate portions of the 1931 CIE Diagram or the 1976 CIE Chromaticity Diagram along the BBL and further represent color tuning capabilities of LED packages according various embodiments disclosed herein. Tunable color characteristics and capabilities for LED packages as disclosed herein may be applicable to any number of lighting applications, including but not limited to indoor lighting, outdoor lighting, retail lighting, and circadian rhythm lighting applications where LED packages are capable of changing spectral emission colors (e.g., between warm white and cool white). In further applications, LED packages with tunable color capabilities may be beneficial for compensating for manufacturing variations in mass-produced LED packages, and for maintaining targeted emission characteristics at various operating temperatures and lifetimes of corresponding LED packages. For tunable color applications related to changes in operating temperatures, thermistors may be incorporated within LED packages to monitor operating temperatures, or thermocouple readings may be measured at one or more test points (e.g., 26 of FIG. 1A) of corresponding LED packages.

Figure 8A:
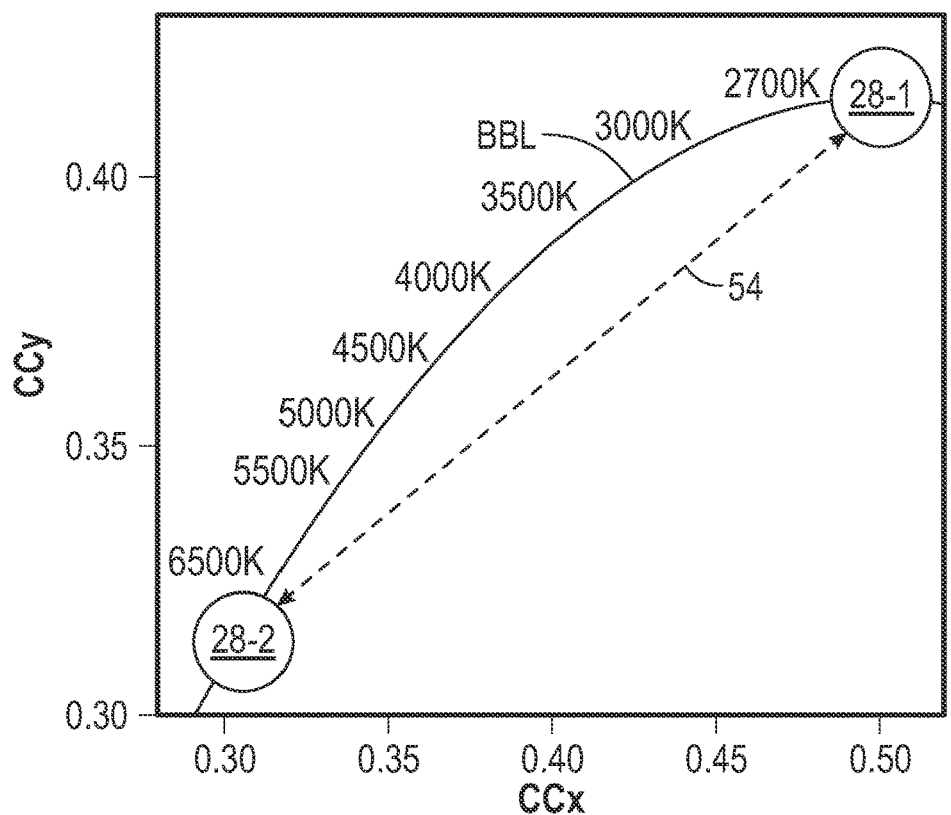
FIGS. 8A-11B illustrate portions of the 1931 CIE Diagram or the 1976 CIE Chromaticity Diagram along the black body locus (BBL) and further represent color tuning capabilities of LED packages according to various embodiments disclosed herein.
Figure 8B:
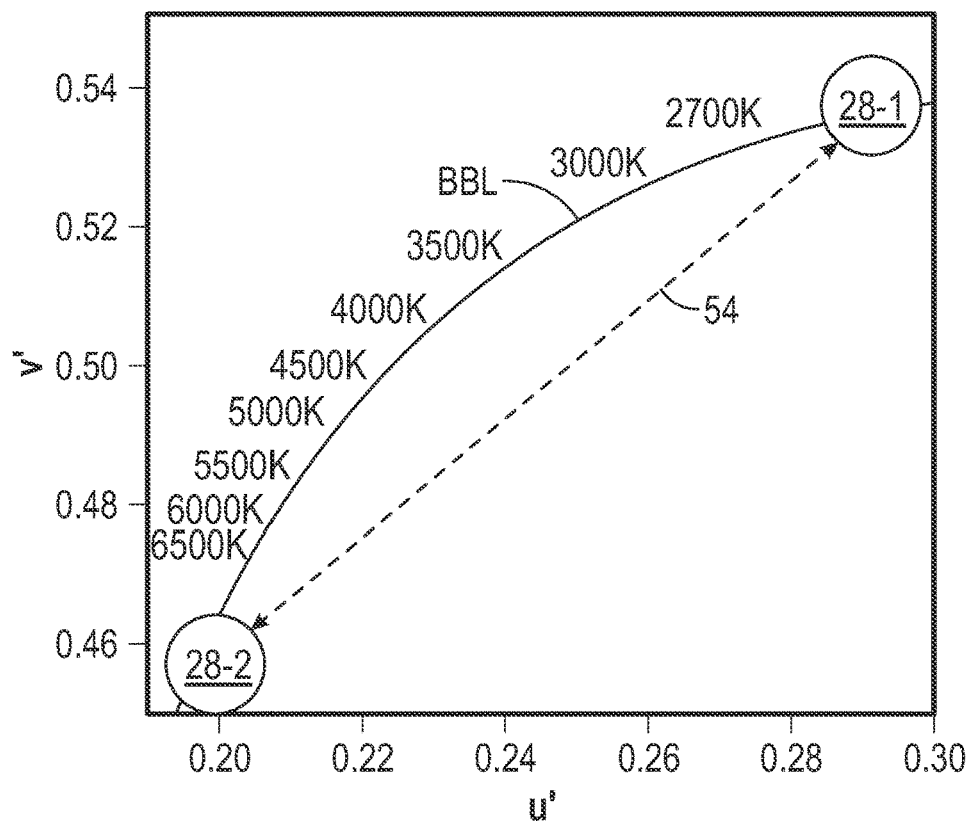

In FIG. 8A, emission characteristics and capabilities are illustrated along a portion of the 1931 CIE Diagram for a representative LED package that includes the first group of the LED chips 28-1 and the second group of the LED chips 28-2 as previously described. In certain embodiments, arrangements of the LED chips 28-1, 28-2 may be provided as described and illustrated in FIGS. 2 and 3. As illustrated in FIG. 8A, the LED chips 28-1 and the LED chips 28-2 are configured to provide emissions with color temperatures that differ by at least 500 K. By way of example, emissions of the LED chips 28-1 are configured below 2700 K (e.g., 2500 K) while emissions of the LED chips 28-2 are configured above 6500 K (e.g., 7000 K) for a difference of about 4500 K. In FIG. 8A, an emission line 54 is illustrated as a straight line that connects between the color temperatures of the respective LED chips 28-1, 28-2. For embodiments where the LED chips 28-1, 28-2 are individually controllable, combined overall emissions of a corresponding LED package may be tuned anywhere on the emission line 54 by separately and independently adjusting drive currents to each of the LED chips 28-1, 28-2. Notably, for larger differences in color temperatures between the LED chips 28-1, 28-2, such as the 4500 K difference illustrated in FIG. 8A, the emission line 54 may deviate away from the BBL, particularly along middle sections of the emission line 54. In certain applications, this deviation from the BBL is acceptable such that the overall emissions are still perceived as white or close to white. In FIG. 8B, the emission characteristics and capabilities represented in FIG. 8A are illustrated along a portion of the 1976 CIE Chromaticity Diagram. In this manner, the emission line 54 defines a range of Du'v' values between the emission line 54 and the BBL and may correspond to LED packages with tunable Du'v' values in a range including 0 to 0.015.

Figure 8C:
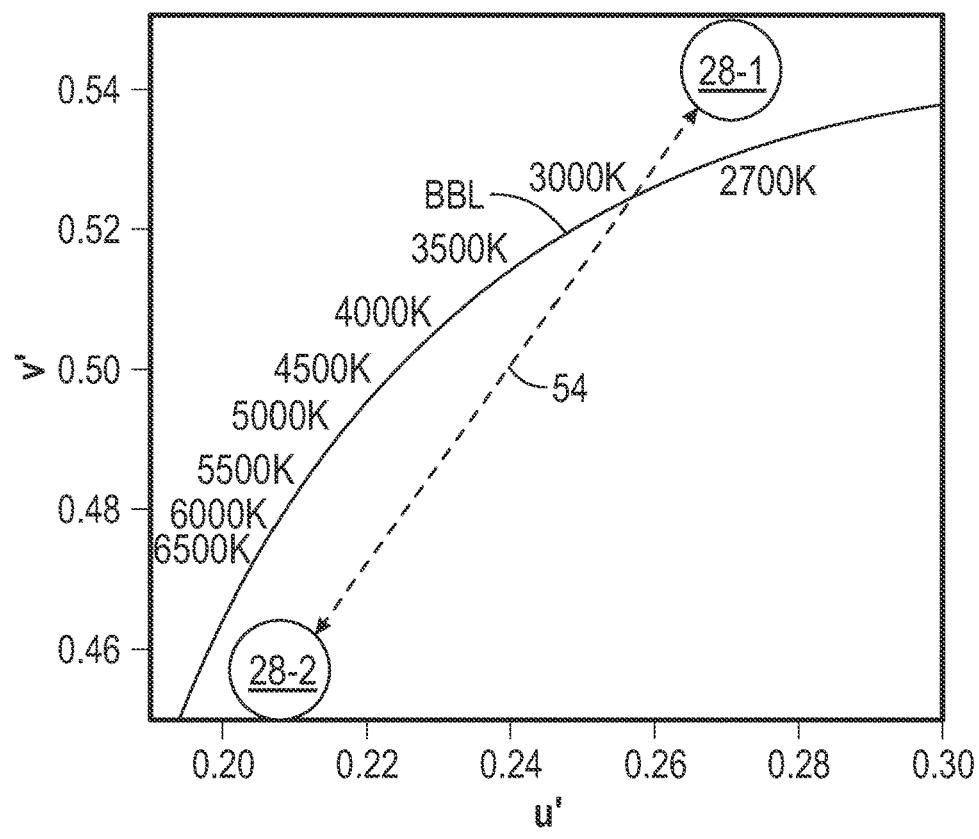

FIG. 8C illustrates a portion of the 1976 CIE Chromaticity Diagram for a representative LED package where the LED chips 28-1 and the LED chips 28-2 are configured with emission characteristics on opposing sides of the BBL according to embodiments disclosed herein. In certain embodiments, arrangements of the LED chips 28-1, 28-2 may be provided as described and illustrated in FIGS. 2 and 3. As illustrated in FIG. 8C, the LED chips 28-1 and the LED chips 28-2 are configured to provide emissions with color temperatures that differ by at least 500 K. By way of example, emissions of the LED chips 28-1 are configured below 2700 K (e.g., 2500 K) and above the BBL while emissions of the LED chips 28-2 are configured above 6500 K (e.g., 7000 K) and below the BBL for a difference of about 4500 K. By configuring emissions for the LED chips 28-1, 28-2 on opposing sides of the BBL, the corresponding emission line 54 may intersect the BBL and thereby define a range of Du'v' values between the emission line 54 and the BBL that are reduced from the embodiments of FIG. 8B. By way of example, emissions of the LED chips 28-1 may be configured with a Du'v' value above the BBL of about 0.004, and emissions of the LED chips 28-2 may be configured with a Du'v' value below the BBL of about 0.004. In this regard, maximum Du'v' values for the corresponding LED package may be defined by the 0.004 values of the respective LED chips 28-1, 28-2. Accordingly, the LED package may be color tunable for any value along the emission line 54 with reduced Du'v' values from the BBL as compared to the embodiments of FIG. 8B. In other embodiments, the LED chips 28-1, 28-2 may be configured on opposing sides of the BBL with different Du'v' values, such as 0.002, or 0.008. In further embodiments, the LED chips 28-1, 28-2 may be configured with different Du'v' values above and below the BBL. For example, the LED chips 28-1 may be configured with a Du'v' value of 0.004 above the BBL and the LED chips 28-2 may be configured with a Du'v' value of 0.008 below the BBL.

Figure 9A:
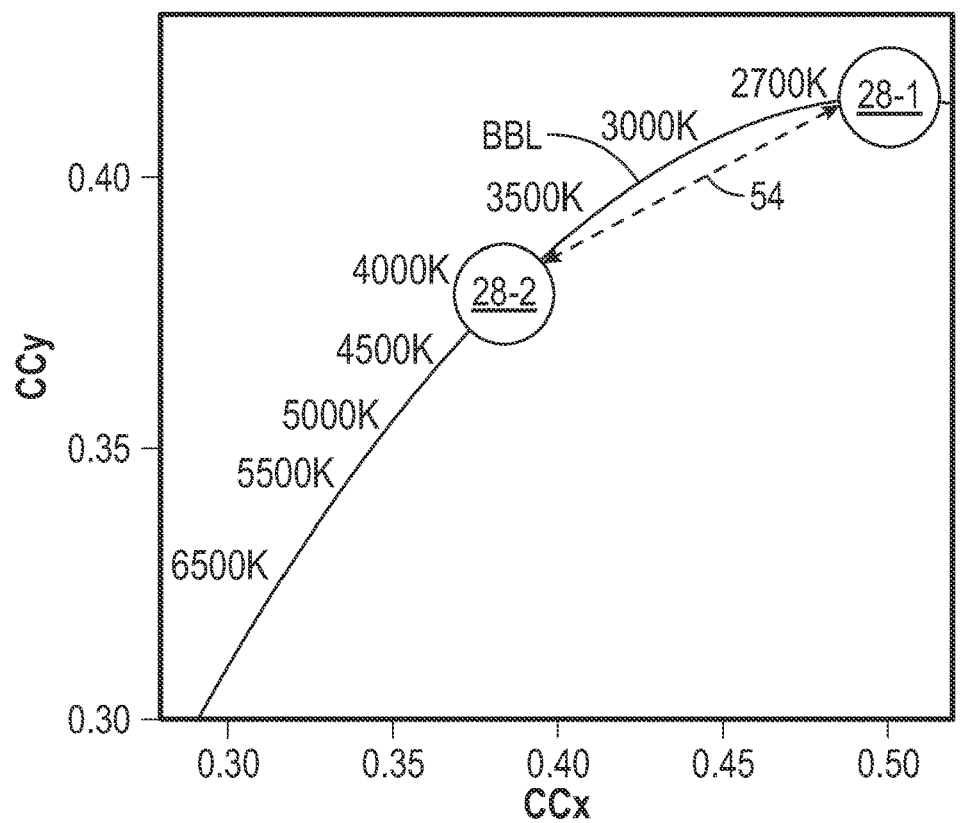
Figure 9B:
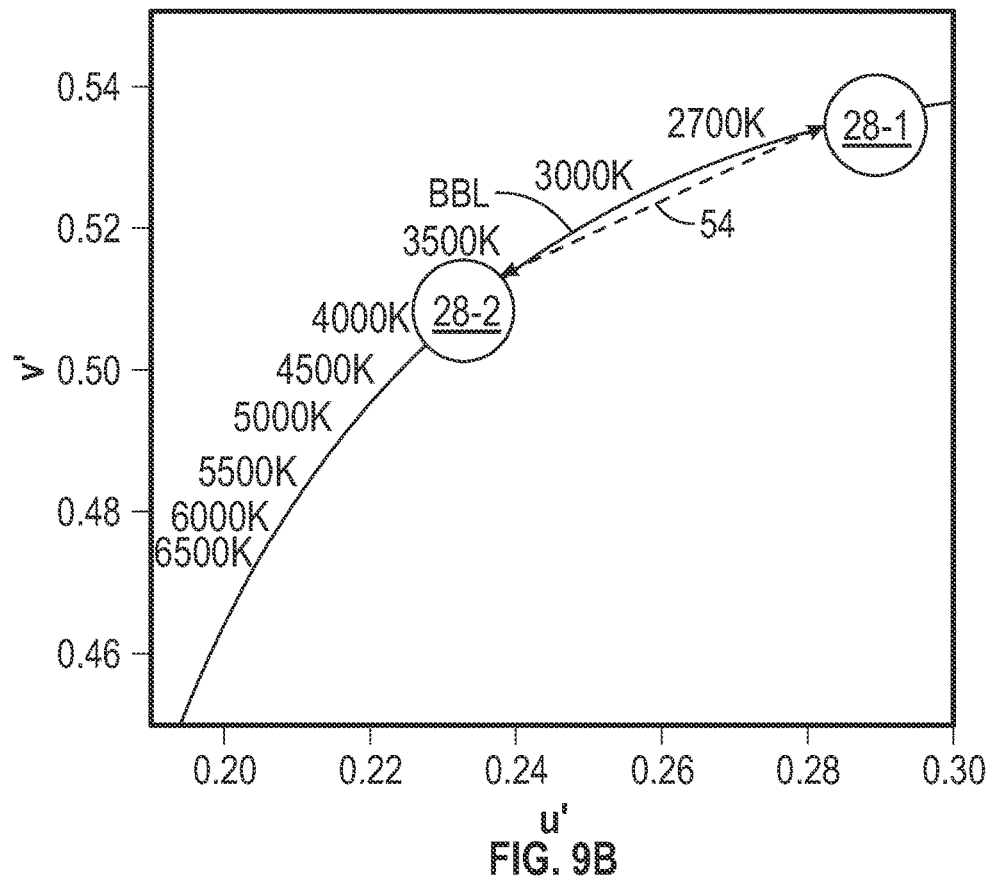

In FIG. 9A, emission characteristics and capabilities are illustrated along a portion of the 1931 CIE Diagram for a representative LED package where the first group of the LED chips 28-1 and the second group of the LED chips 28-2 are configured with smaller color temperature differences than FIG. 8A. For example, emissions of the LED chips 28-1 are configured below 2700 K (e.g., 2500 K) while emissions of the LED chips 28-2 are configured at 4000 K for a difference of about 1500 K. In this regard, the emission line 54 is configured closer to the BBL than in FIG. 8A. In certain embodiments, arrangements of the LED chips 28-1, 28-2 represented in FIG. 9A may be provided as described and illustrated in FIGS. 2 and 3. In FIG. 9B, the emission characteristics and capabilities represented in FIG. 9A are illustrated along a portion of the 1976 CIE Chromaticity Diagram. In this manner, the emission line 54 defines a range of Du'v' values between the emission line 54 and the BBL may correspond to LED packages with tunable Du'v' values in a range including 0 to 0.002. As illustrated, when respective emissions of the LED chips 28-1, 28-2 are closer to one another along the BBL, the corresponding range of Du'v' values between the emission line 54 and the BBL will also be smaller.

Figure 10:
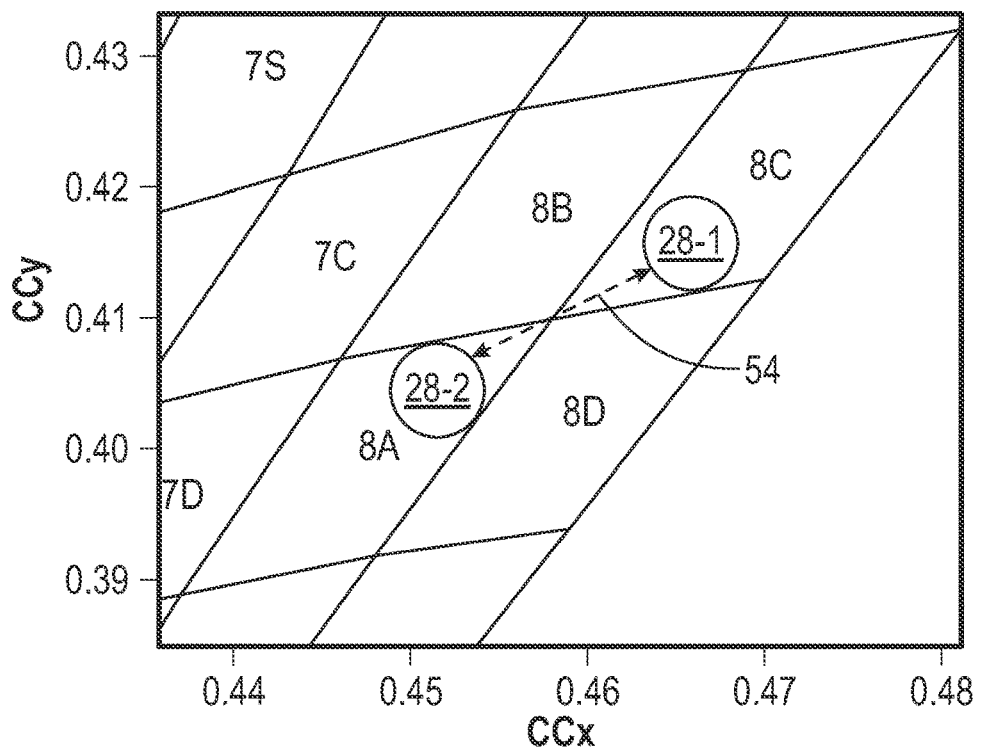

In FIG. 10, emission characteristics and capabilities are illustrated along a portion of the 1931 CIE Diagram for a representative LED package where the first group of the LED chips 28-1 and the second group of the LED chips 28-2 are configured with even smaller color temperature differences. In certain embodiments, emissions characteristics of LED packages are tunable within a common ANSI defined white bin. By way of example, FIG. 10 represents the ANSI defined color bin for 2700 K that is subdivided into four quadrants 8A, 8B, 8C, and 8D. The LED chips 28-1 are configured to provide emissions within the quadrant 8C while the LED chips 28-2 are configured to provide emission within the quadrant 8A. In this regard, emission characteristics of the representative LED package may be tunable within a common ANSI defined color bin, or within a color temperature difference of 500 K or less. This may be advantageous for compensating for small deviations in LED wavelengths or small deviations in lumiphoric material mixtures or lumiphoric material quantities that may occur during the manufacturing of high volumes of LED packages that target the same emission characteristics. In certain embodiments, arrangements of the LED chips 28-1, 28-2 represented in FIG. 10 may be provided as described and illustrated in FIGS. 2 and 3. While FIG. 10 represents a particular ANSI defined color bin, embodiments as disclosed herein are also applicable to any defined color bin, such as a target color bin that is offset or encompasses portions of different ANSI defined color bins.

Figure 11A:
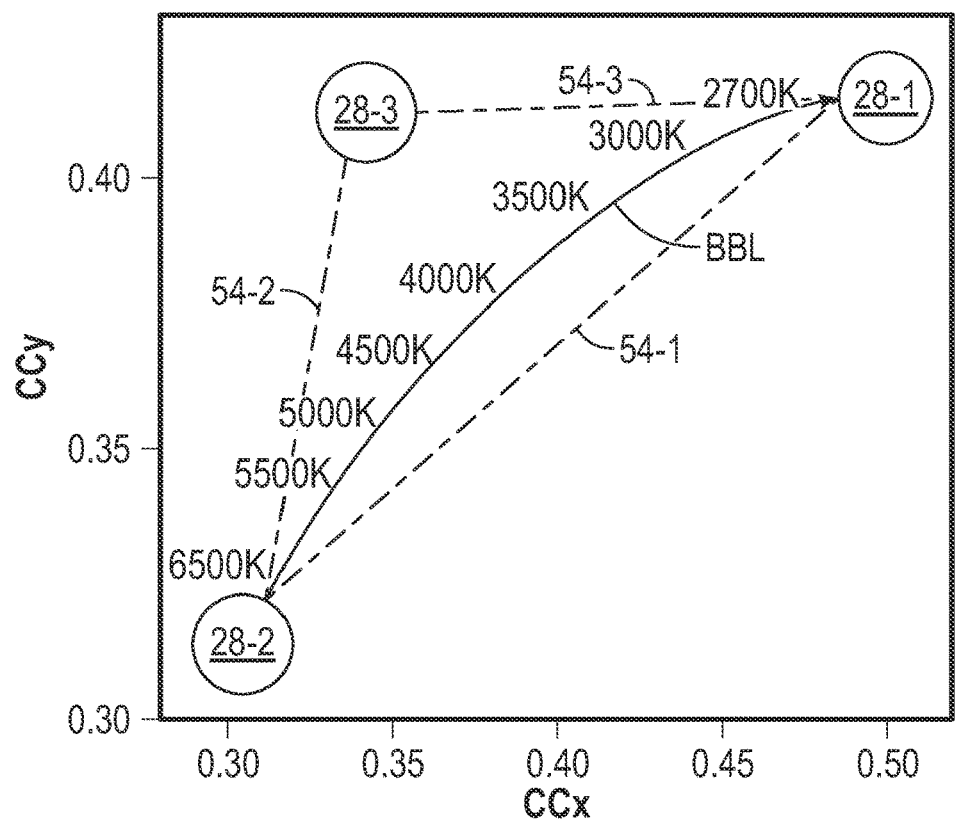
Figure 11B:
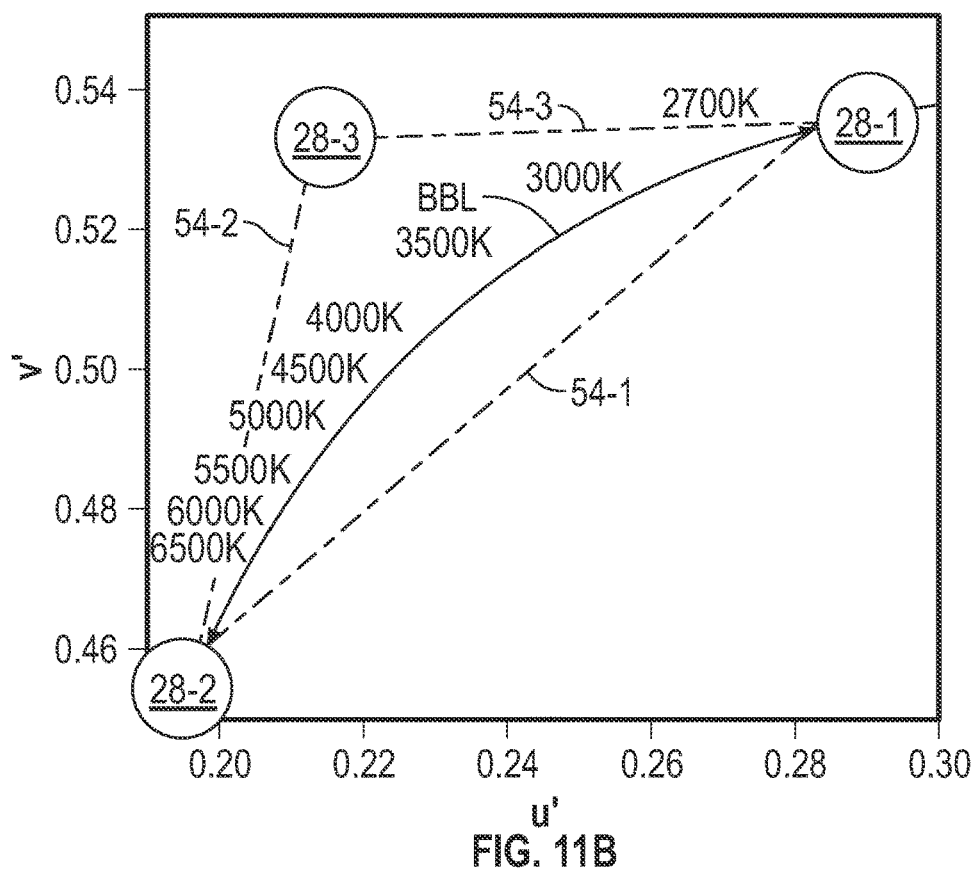

In FIG. 11A, emission characteristics and capabilities are illustrated along a portion of the 1931 CIE Diagram for a representative LED package that includes three groups of individually controllable LED chips 28-1 to 28-3. In certain embodiments, arrangements of the LED chips 28-1 to 28-3 represented in FIG. 11A may be provided as described and illustrated in FIG. 4. As illustrated in FIG. 11A, emission characteristics of each of the LED chips 28-1 to 28-3 may be configured in three different color space regions. By way of example, emissions of the LED chips 28-1 are configured below 2700 K (e.g., 2500 K) along the BBL, emissions of the LED chips 28-2 are configured above 6500 K (e.g., 7000 K) along the BBL, and emissions of the LED chips 28-3 are configured a certain distance above the BBL. In this regard, three emissions lines 54-1 to 54-3 define a two-dimensional color region (e.g., a triangle in FIG. 11A) in which the representative LED package may be tuned. In certain embodiments, it may be advantageous to provide emissions that are tunable along the BBL, regardless of how far apart emissions of the LED chips 28-1, 28-2 are along the BBL. In certain embodiments, the LED chips 28-3 may comprise LED chips with lumiphoric materials, while in other embodiments the LED chips 28-3 may comprise single color or monochromatic LED chips devoid of corresponding lumiphoric materials. In FIG. 11B, the emission characteristics and capabilities represented in FIG. 11A are illustrated along a portion of the 1976 CIE Chromaticity Diagram. In this manner, the emission lines 54-1 to 54-3 define a range of Du'v' values from the BBL that correspond to the tunable two-dimensional color region between the emission lines 54-1 to 54-3.

As illustrated in FIGS. 8A-11B, embodiments are disclosed herein that provide LED devices and packages with overall color points that are tunable along the BBL or tunable within certain color point bins. In certain embodiments, LED devices and packages are disclosed that have tunable Du'v' values in a range including 0 to 0.015, or in a range including 0 to 0.004, or in a range including 0 to 0.002. The particular range of tunable Du'v' values can be dependent on the magnitude of a difference in CCT value between color points of two different LED chips or two different groups of LED chips. For example, the embodiments of FIG. 8B illustrate a higher magnitude of difference between LED chip color points (e.g., 28-1, 28-2) than the embodiments of FIG. 9B. Accordingly, tunable Du'v' values can be greater for the embodiments of FIG. 8B relative to the embodiments of FIG. 9B. Additionally, the embodiments of FIG. 8C illustrate tunable Du'v' values that correspond to the positions of the LED chip color points relative to the BBL.

According to embodiments disclosed herein, alternating patterns and other arrangements of lumiphoric regions as described herein may be formed in a variety of manners. In certain embodiments, different lumiphoric regions may formed by selective application of lumiphoric materials to different LED chips or different groups of LED chips. Selective application may be provided by way of deposition, dispensing, or otherwise applying lumiphoric materials to corresponding LED chips or by providing the lumiphoric regions as preformed structures that are subsequently placed on corresponding LED chips.

Figure 12A:
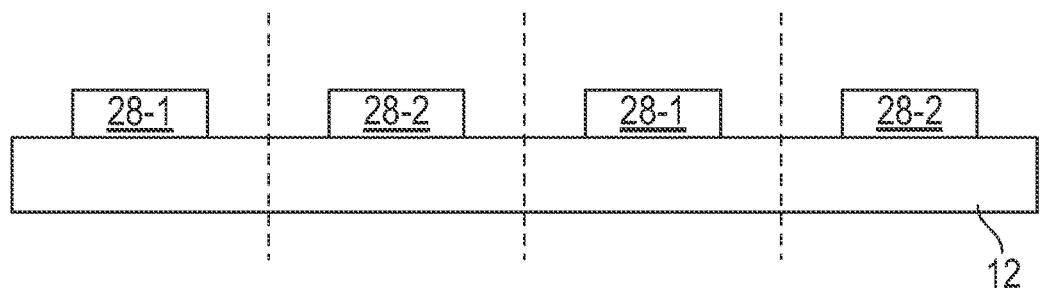
FIGS. 12A-12D are cross-sectional views of LED chips at various states of fabrication illustrating selective application of lumiphoric materials to different groups of LED chips according to embodiments disclosed herein.
Figure 12B:
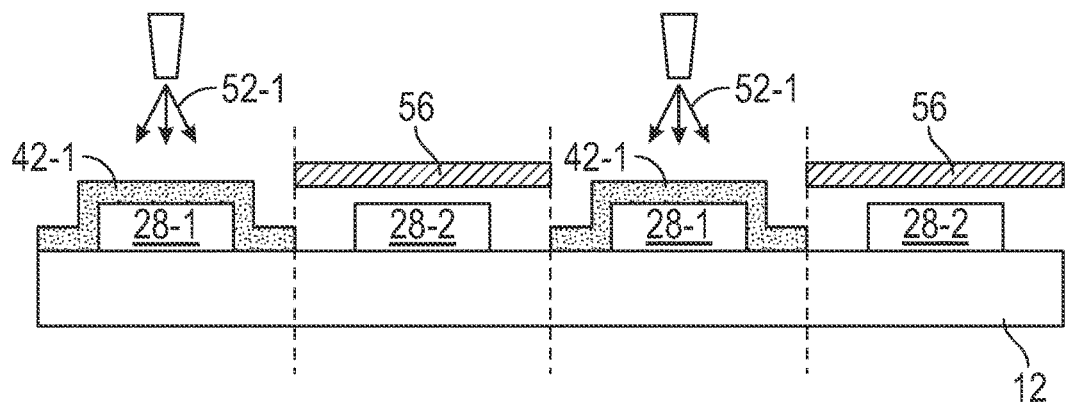
Figure 12C:
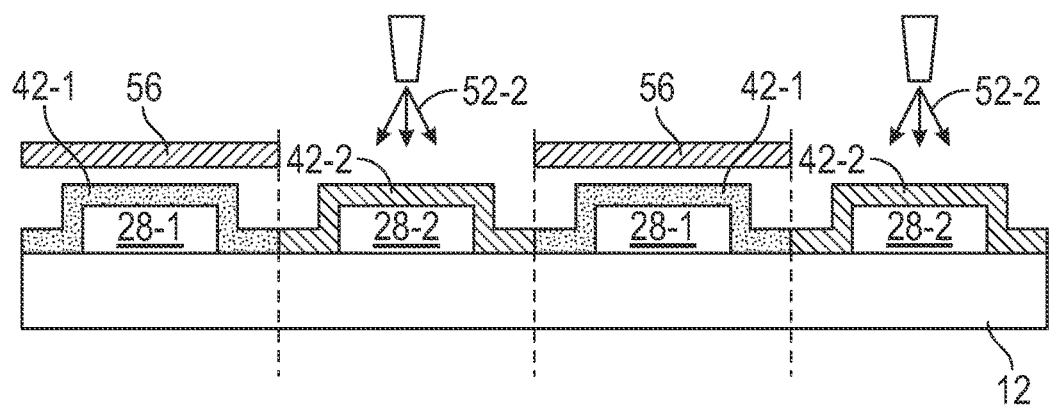
Figure 12D:
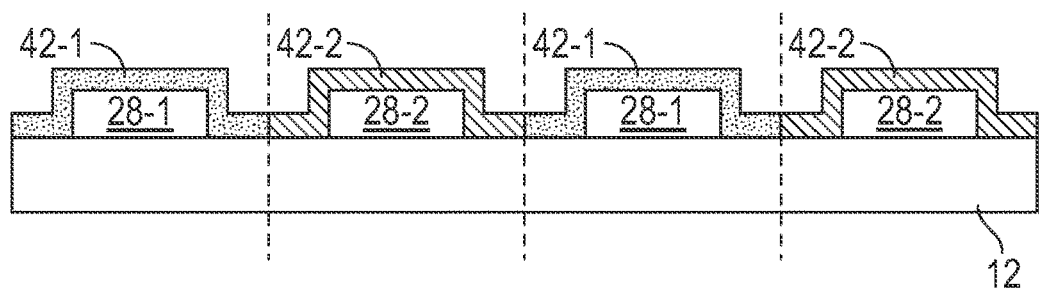

FIGS. 12A-12D are cross-sectional views of the first and second groups of LED chips 28-1, 28-2 at various states of fabrication illustrating selective application of lumiphoric materials to the LED chips 28-1, 28-2. FIG. 12A illustrates the first and second groups of LED chips 28-1, 28-2 arranged on the submount 12 with superimposed vertical dashed lines provided to indicate lateral boundaries of intended emission regions on the submount 12. In FIG. 12B, a mask or stencil 56 is arranged to cover the second group of LED chips 28-2 while the first lumiphoric regions 42-1 are formed over the first group of LED chips 28-1. In certain embodiments, the first lumiphoric regions 42-1 are formed by spray coating a first lumiphoric material 52-1 through the mask or stencil 56. In this manner, surfaces of the LED chips 28-1 as well as surfaces of the submount 12 adjacent mounting surfaces of the LED chips 28-1 may be conformally coated by the lumiphoric regions 42-1. In FIG. 12C, the mask or stencil 56 is arranged to cover the first lumiphoric regions 42-1, and the second lumiphoric regions 42-2 are formed by spray coating a second lumiphoric material 52-2 over the LED chips 28-2 and adjacent portions of the submount 12 as previously described. As illustrated in FIG. 12D, the first and second lumiphoric regions 42-1, 42-2 are accordingly arranged to be registered with corresponding ones of the first and second LED chips 28-1, 28-2. As further illustrated in FIG. 12D, the lumiphoric regions 42-1, 42-2 may be configured with lateral dimensions greater than lateral dimensions corresponding LED chips 28-1, 28-2. In this manner, lateral emissions from the LED chips 28-1, 28-2 are configured to pass through the lumiphoric regions 42-1, 42-2 for improved wavelength conversion in such spaces.

Figure 13:
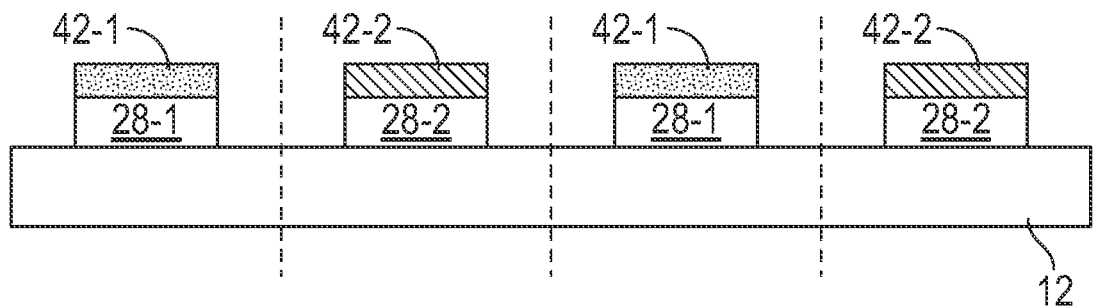
FIG. 13 is a cross-sectional view of LED chips for embodiments where lumiphoric regions are arranged with similar lateral dimensions of corresponding LED chips.

FIG. 13 is a cross-sectional view of the first and second groups of LED chips 28-1, 28-2 for embodiments where the lumiphoric regions 42-1, 42-2 are arranged with similar lateral dimensions of corresponding LED chips 28-1, 28-2. In certain embodiments, the lumiphoric regions 42-1, 42-2 may be formed as described for FIGS. 12A-12D, but with appropriately sized masks 56. In other embodiments, the lumiphoric regions 42-1, 42-2 may be provided as preformed structures that are subsequently applied or attached to the LED chips 28-1, 28-2. For example, one or more of the lumiphoric regions 42-1, 42-2 may comprise a transparent support substrate, or superstrate, that supports one or more corresponding lumiphoric materials. The term "superstrate" is used herein, in part, to avoid confusion with other substrates that may be part of the semiconductor light-emitting device, such as a growth or carrier substrate of the LED chip 28-1, 28-2 or the submount 12. The term "superstrate" is not intended to limit the orientation, location, and/or composition of the structure it describes. In some embodiments, the superstrate may be composed of, for example, sapphire, silicon carbide, silicone, and/or glass (e.g., borosilicate and/or fused quartz). The superstrate may be patterned to enhance light extraction from the LED chips 28-1, 28-2 as described in commonly-assigned U.S. Provisional Application No. 62/661,359 entitled "Semiconductor Light Emitting Devices Including Superstrates With Patterned Surfaces" which is hereby incorporated by reference herein. The superstrate may also be configured as described in commonly-assigned U.S. Patent Application Publication No. 2018/0033924, now U.S. Pat. No. 10,290,777, also incorporated by reference herein. The superstrate may be formed from a bulk substrate which is optionally patterned and then singulated. In some embodiments, the patterning of the superstrate may be performed by an etching process (e.g., wet or dry etching). In some embodiments, the patterning of the superstrate may be performed by otherwise altering the surface, such as by a laser or saw. In some embodiments, the superstrate may be thinned before or after the patterning process is performed. Lumiphoric materials may be placed on superstrates by, for example, one or more spraying and/or otherwise coating steps. In this regard, the lumiphoric regions 42-1, 42-2 may be provided as preformed structures that can be attached to the LED chips 28-1, 28-2 using, for example, a layer of transparent adhesive. In other embodiments, the lumiphoric regions 42-1, 42-2 may be provided as preformed structures that comprise one or more lumiphoric materials embedded in a binder or host material, such as lumiphoric materials in glass or silicone. In still further embodiments, the lumiphoric regions 42-1, 42-2 may be provided as preformed structures that comprise ceramic phosphor plates. In still further embodiments, the lumiphoric regions 42-1, 42-2 may comprise one or more lumiphoric material sheets, such as phosphor sheets. Lumiphoric material sheets may comprise solid sheets of lumiphoric materials embedded within a binder such as a polymer matrix. The lumiphoric material sheets may be provided to individual ones of the LED chips 28-1, 28-2, or to one or more groups of the LED chips 28-1, 28-2.

Figure 14:
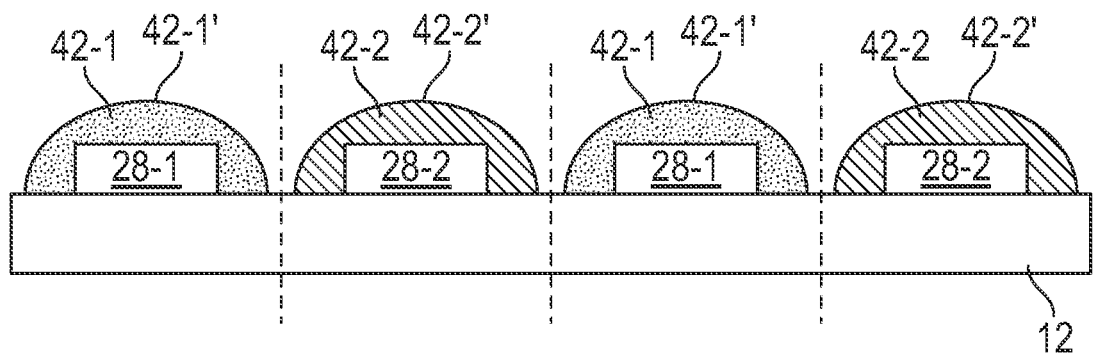
FIGS. 14 and 15 are cross-sectional views of LED chips for embodiments where lumiphoric regions are formed with curved surfaces over corresponding LED chips.
Figure 15:
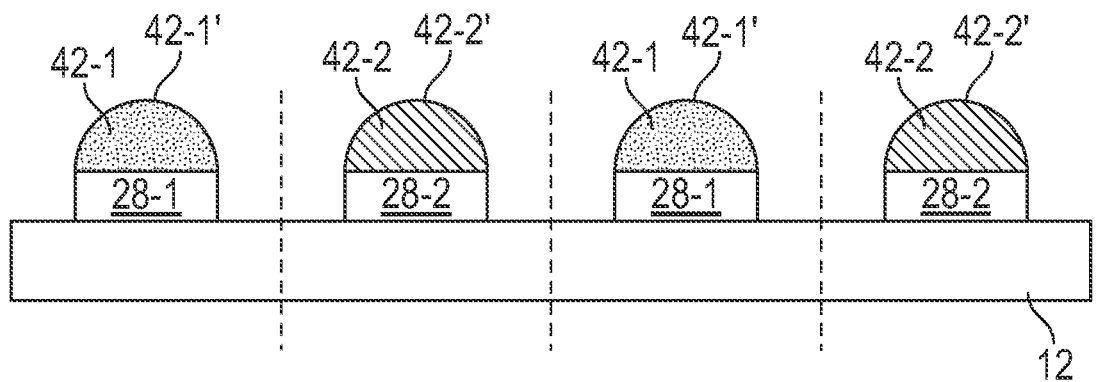

FIGS. 14 and 15 are cross-sectional views of the first and second groups of LED chips 28-1, 28-2 for embodiments where the lumiphoric regions 42-1, 42-2 are formed with curved surfaces 42-1', 42-2' over corresponding LED chips 28-1, 28-2. As illustrated, the curved surfaces 42-1', 42-2' are provided above the LED chips 28-1, 28-2, and may accordingly form lenses or optics configured to provide one or more of improved light extraction and tailored light distributions for the LED chips 28-1, 28-2. Such lumiphoric regions 42-1, 42-2 with curved surfaces 42-1', 42-2' may be formed, for example, by a dispensing process where a viscosity of the dispensed lumiphoric materials may form the curved surfaces 42-1', 42-2'. In other embodiments, the lumiphoric regions 42-1, 42-2 with curved surfaces 42-1', 42-2' may be formed by a molding process. As such, the lumiphoric regions 42-1, 42-2 may be formed with any number of shapes depending on the desired application, included combinations of curved and planar surfaces. In FIG. 14, the lumiphoric regions 42-1, 42-2 are formed over the LED chips 28-1, 28-2 as well as portions of the submount 12 that are adjacent the LED chips 28-1, 28-2. In FIG. 15, the lumiphoric regions 42-1, 42-2 are formed only over top surfaces of the LED chips 28-1, 28-2 such that lateral dimensions of the lumiphoric regions 42-1, 42-2 are the same or similar to the LED chips 28-1, 28-2.

While various configurations of LED packages are described above, the aspects disclosed herein are also applicable to various other LED packages In certain embodiments, LED packages may be configured as set forth in the following commonly-assigned U.S. patents and U.S. publications, which are hereby incorporated by reference herein: U.S. Pat. Nos. 8,866,169; 9,070,850; 9,000,470; 9,887,327; 10,074,635, and 10,468,565.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
mounting a plurality of light-emitting diode (LED) chips on a submount, the plurality of LED chips comprising a first group of LED chips and a second group of LED chips;
selectively forming a plurality of first lumiphoric regions on the first group of LED chips; and
selectively forming a plurality of second lumiphoric regions on the second group of LED chips, individual first lumiphoric regions of the plurality of first lumiphoric regions being provided in an alternating arrangement with individual second lumiphoric regions of the plurality of second lumiphoric regions, the alternating arrangement comprising connecting corners of the individual first lumiphoric regions of the plurality of first lumiphoric regions and connecting corners of the individual second lumiphoric regions of the plurality of second lumiphoric regions.

2. The method of claim 1, wherein:
the plurality of first lumiphoric regions are formed through a mask that covers the second group of LED chips; and
the plurality of second lumiphoric regions are formed through a mask that covers the first group of LED chips.

3. The method of claim 1, wherein:
the first group of LED chips and the plurality of first lumiphoric regions are configured to provide emissions of a first correlated color temperature (CCT) value; and
the second group of LED chips and the plurality of second lumiphoric regions are configured to provide emissions of a second CCT value that differs from the first CCT value.

4. The method of claim 3, wherein each of the first group of LED chips and the second group of LED chips is individually controllable.

5. The method of claim 1, wherein the plurality of LED chips, the plurality of first lumiphoric regions and the plurality of second lumiphoric regions form an emission area of an LED package, and the alternating arrangement comprises a checkerboard pattern in at least twenty-five percent of the emission area.

6. The method of claim 1, wherein:
the plurality of first lumiphoric regions are formed by spray coating the first lumiphoric regions on the first group of LED chips and on surfaces of the submount that are adjacent mounting surfaces of each LED chip of the first group of LED chips; and
the plurality of second lumiphoric regions are formed by spray coating the second lumiphoric regions on the second group of LED chips and on surfaces of the submount that are adjacent mounting surfaces of each LED chip of the second group of LED chips.

7. The method of claim 1, wherein:
the plurality of first lumiphoric regions comprise preformed structures that are attached to the first group of LED chips; and
the plurality of second lumiphoric regions comprise preformed structures that are attached to the second group of LED chips.

8. The method of claim 7, wherein the preformed structures comprise at least one of a lumiphoric material on a surface of a transparent support substrate, a lumiphoric material that is embedded within a binder, and a ceramic phosphor plate.

9. The method of claim 1, wherein:
the plurality of first lumiphoric regions comprise a curved surface above the first group of LED chips; and
the plurality of second lumiphoric regions comprise a curved surface above the second group of LED chips.

10. The method of claim 1, wherein:
the plurality of first lumiphoric regions are formed by dispensing the first lumiphoric regions on the first group of LED chips; and
the plurality of second lumiphoric regions are formed by dispensing the second lumiphoric regions on the second group of LED chips.

11. The method of claim 10, further comprising:
dispensing the first lumiphoric regions on surfaces of the submount that are adjacent mounting surfaces of each LED chip of the first group of LED chips; and
dispensing the second lumiphoric regions on surfaces of the submount that are adjacent mounting surfaces of each LED chip of the second group of LED chips.

12. A method comprising:
mounting a plurality of light-emitting diode (LED) chips on a submount; and
forming a plurality of first lumiphoric regions in an alternating arrangement with a plurality of second lumiphoric regions on the submount to form an emission area of an LED package that is registered with the plurality of LED chips, the plurality of first lumiphoric regions being discrete regions from the plurality of second lumiphoric regions;
wherein the alternating arrangement comprises individual first lumiphoric regions of the plurality of first lumiphoric regions that are in contact with individual second lumiphoric regions of the plurality of second lumiphoric regions.

13. The method of claim 12, wherein the plurality of LED chips comprises:
a first group of LED chips that are registered with the plurality of first lumiphoric regions to provide emissions of a first correlated color temperature (CCT) value; and
a second group of LED chips that are registered with the plurality of second lumiphoric regions to provide emissions of a second CCT value that differs from the first CCT value, wherein each of the first group of LED chips and the second group of LED chips is individually controllable.

14. The method of claim 13, wherein the first CCT value differs from the second CCT value by at least 500 K.

15. The method of claim 13, wherein the emission area is tunable between the first CCT value and the second CCT value.

16. The method of claim 13, wherein the first CCT value is configured above a blackbody locus and the second CCT value is configured below the blackbody locus.

17. The method of claim 12, wherein:
the plurality of LED chips comprises a first group of LED chips and a second group of LED chips;
the plurality of first lumiphoric regions are formed through a mask that covers the second group of LED chips; and
the plurality of second lumiphoric regions are formed through a mask that covers the first group of LED chips.

18. The method of claim 12, wherein:
the plurality of LED chips comprises a first group of LED chips and a second group of LED chips;

the plurality of first lumiphoric regions comprise preformed structures that are attached to the first group of LED chips after the first group of LED chips are mounted to the submount; and the plurality of second lumiphoric regions comprise preformed structures that are attached to the second group of LED chips after the second group of LED chips are mounted to the submount.

* * * * *

UNITED STATES PATENT AND TRADEMARK OFFICE
CERTIFICATE OF CORRECTION

PATENT NO. : 11,510,294 B2
APPLICATION NO. : 17/364987
DATED : November 22, 2022
INVENTOR(S) : Aaron Francis et al.

It is certified that error appears in the above-identified patent and that said Letters Patent is hereby corrected as shown below:

In the Specification

Column 20, Lines 56-57, replace "A is the emission wavelength" with --$\lambda$ is the emission wavelength--.

In the Claims

Claim 2, Column 27, Lines 23-24, replace "a mask that covers the second group of LED chips" with --a mask that covers each LED chip of the second group of LED chips--.
Claim 2, Column 27, Lines 26-27, replace "a mask that covers the first group of LED chips" with --a mask that covers each LED chip of the first group of LED chips.--.
Claim 9, Column 28, Lines 2-3, replace "a curved surface above the first group of LED chips" with --a curved surface above each LED chip of the first group of LED chips--.
Claim 9, Column 28, Lines 4-5, replace "a curved surface above the second group of LED chips" with --a curved surface above each LED chip of the second group of LED chips--.

Signed and Sealed this
Fourteenth Day of February, 2023

Katherine Kelly Vidal
*Director of the United States Patent and Trademark Office*